(12) United States Patent
He

(10) Patent No.: US 11,028,857 B2
(45) Date of Patent: *Jun. 8, 2021

(54) COOLING MODULE WITH BLOWER SYSTEM HAVING OPPOSITE, BLOWER AND IMPELLER OUTLETS FOR INFORMATION HANDLING SYSTEMS

(71) Applicant: Dell Products, LP, Round Rock, TX (US)

(72) Inventor: Qinghong He, Austin, TX (US)

(73) Assignee: Dell Products, LP, Round Rock, TX (US)

(*) Notice: Subject to any disclaimer, the term of this patent is extended or adjusted under 35 U.S.C. 154(b) by 97 days.

This patent is subject to a terminal disclaimer.

(21) Appl. No.: 16/575,251

(22) Filed: Sep. 18, 2019

(65) Prior Publication Data

US 2021/0079926 A1     Mar. 18, 2021

(51) Int. Cl.
| | |
|---|---|
| *F04D 29/30* | (2006.01) |
| *F04D 29/28* | (2006.01) |
| *F04D 19/00* | (2006.01) |
| *F04D 29/42* | (2006.01) |
| *F04D 19/02* | (2006.01) |
| *F04D 25/08* | (2006.01) |

(52) U.S. Cl.
CPC .......... *F04D 29/30* (2013.01); *F04D 19/007* (2013.01); *F04D 19/024* (2013.01); *F04D 29/281* (2013.01); *F04D 29/4226* (2013.01); *F04D 25/08* (2013.01); *F05D 2240/30* (2013.01)

(58) Field of Classification Search
None
See application file for complete search history.

(56) References Cited

U.S. PATENT DOCUMENTS

| | | | |
|---|---|---|---|
| 2,330,938 | A | 10/1943 | Williams |
| 3,592,260 | A | 7/1971 | Berger |
| 3,950,112 | A | 4/1976 | Crump |
| 6,021,042 | A | 2/2000 | Anderson |
| 6,328,097 | B1 | 12/2001 | Bookhardt |
| 6,373,700 | B1 | 4/2002 | Wang |
| 6,525,936 | B2 | 2/2003 | Beitelmal |
| 6,567,269 | B2 | 5/2003 | Homer |

(Continued)

*Primary Examiner* — Michael Lebentritt
(74) *Attorney, Agent, or Firm* — Prol Intellectual Property Law, PLLC; H. Kenneth Prol

(57) ABSTRACT

An information handling system comprising a chassis supporting a central processor, a graphics processor, a memory, and a power source and a dual opposite combined blower and impeller system having a powered blower fan for rotating a plurality of blades within a dual opposite combined blower and impeller system housing where the dual opposite combined blower and impeller system housing includes first surface and a second surface oppositely disposed on either side of a rotational plane of the powered blower fan, a first side wall and a second side wall oppositely disposed to the first side wall. The dual opposite combined blower and impeller system housing includes a first blower outlet aperture in the rotational plane of the blower fan moving air in a first direction on a blower side and a second, curvilinear impeller aperture in the rotational plane of the blower fan moving air in a spread airflow in a second direction generally opposite to the first direction.

20 Claims, 10 Drawing Sheets

(56) References Cited

U.S. PATENT DOCUMENTS

| | | |
|---|---|---|
| 6,652,223 B1 | 11/2003 | Horng |
| 6,789,999 B2 | 9/2004 | Bikos |
| 6,989,988 B2 | 1/2006 | Arbogast |
| 7,071,587 B2 | 7/2006 | Lopatinsky |
| 7,079,388 B2 | 7/2006 | Faneuf |
| 7,079,394 B2 | 7/2006 | Mok |
| 7,215,543 B2 | 5/2007 | Arbogast |
| 8,104,295 B2 | 1/2012 | Lofy |
| 8,142,147 B2 | 3/2012 | O'Connor |
| 9,845,805 B2 | 12/2017 | Bhutani |
| 10,485,135 B2 | 11/2019 | He |
| 10,539,150 B2 | 1/2020 | Ling |
| 10,584,717 B1* | 3/2020 | He ............... H05K 7/20154 |
| 10,687,440 B1 | 6/2020 | He |
| 2002/0172008 A1 | 11/2002 | Michael |
| 2003/0161102 A1 | 8/2003 | Lee |
| 2003/0220721 A1 | 11/2003 | Cohen |
| 2004/0099404 A1 | 5/2004 | Cipolla |
| 2006/0078428 A1 | 4/2006 | Zheng |
| 2006/0193113 A1 | 8/2006 | Cohen |
| 2006/0263210 A1 | 11/2006 | Wang |
| 2006/0286925 A1* | 12/2006 | Chen ............... F04D 29/601 454/339 |
| 2007/0160462 A1 | 7/2007 | Tsang |
| 2007/0227699 A1 | 10/2007 | Nishi |
| 2007/0268668 A1 | 11/2007 | Lin |
| 2008/0035315 A1 | 2/2008 | Han |
| 2008/0229758 A1 | 9/2008 | Lin |
| 2009/0022587 A1* | 1/2009 | Yoshida ............ F04D 19/007 415/213.1 |
| 2009/0041582 A1* | 2/2009 | Liang ............... F04D 29/051 416/144 |
| 2009/0266518 A1 | 10/2009 | Huang |
| 2009/0324403 A1* | 12/2009 | Zheng ............ F04D 25/0613 415/203 |
| 2010/0071875 A1 | 3/2010 | Hwang |
| 2010/0247344 A1* | 9/2010 | Yang ............... F04D 29/384 417/410.1 |
| 2011/0097195 A1 | 4/2011 | Horng |
| 2011/0108251 A1* | 5/2011 | Horng ............ F04D 25/0613 165/121 |
| 2011/0110774 A1 | 5/2011 | Horng |
| 2011/0203295 A1 | 8/2011 | Hsu |
| 2011/0251733 A1 | 10/2011 | Atkinson |
| 2011/0272120 A1 | 11/2011 | Joshi |
| 2013/0011255 A1 | 1/2013 | Horng |
| 2013/0243628 A1 | 9/2013 | Zheng |
| 2014/0063726 A1 | 3/2014 | Liu |
| 2014/0092556 A1 | 4/2014 | Turney |
| 2014/0185240 A1 | 7/2014 | Macdonald |
| 2015/0003974 A1 | 1/2015 | Heymann |
| 2015/0116928 A1 | 4/2015 | Delano |
| 2016/0003261 A1 | 1/2016 | Tamaoka |
| 2016/0037683 A1 | 2/2016 | Tamaoka |
| 2016/0369811 A1 | 12/2016 | Ling |
| 2017/0359920 A1 | 12/2017 | Huang |
| 2018/0142708 A1* | 5/2018 | Horng ............ F04D 29/522 |
| 2019/0008073 A1 | 1/2019 | He |
| 2019/0184868 A1 | 6/2019 | Kim |
| 2020/0027808 A1 | 1/2020 | Subrahmanyam |
| 2020/0352051 A1* | 11/2020 | He ............... F04D 29/4246 |

* cited by examiner

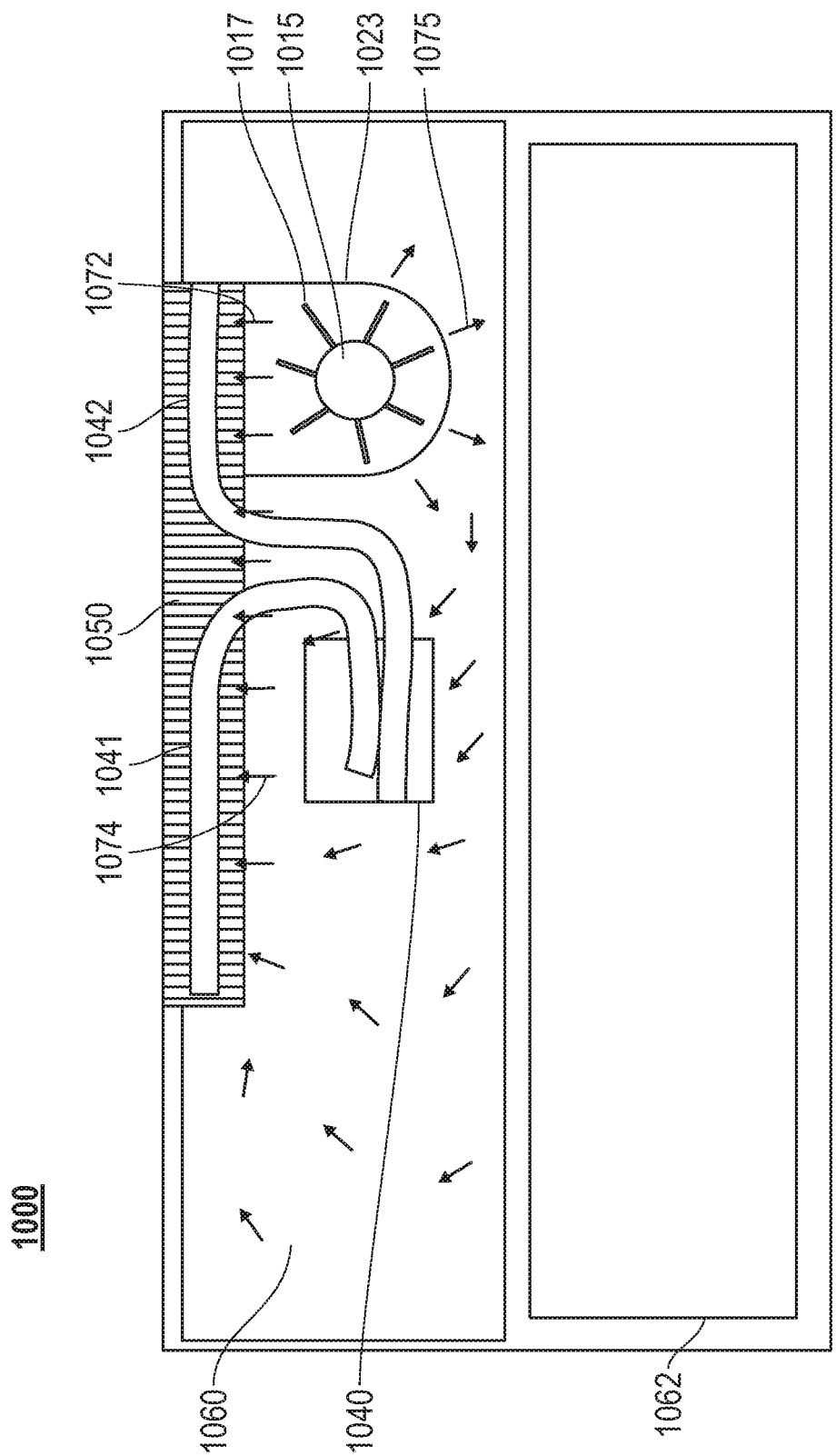

US 11,028,857 B2

COOLING MODULE WITH BLOWER SYSTEM HAVING OPPOSITE, BLOWER AND IMPELLER OUTLETS FOR INFORMATION HANDLING SYSTEMS

CROSS REFERENCE TO RELATED APPLICATIONS

Related subject matter is contained in the following co-pending applications:

U.S. application Ser. No. 16/395,138, filed Apr. 25, 2019, entitled "BLOWER SYSTEM WITH DUAL OPPOSITE OUTLETS AND FAN DIAMETER APPROACHING TO BLOWER HOUSING DIMENSION FOR INFORMATION HANDLING SYSTEMS," invented by Qinghong He et al., and assigned to the assignee hereof.

U.S. application Ser. No. 16/402,885, filed May 3, 2019, entitled "COOLING MODULE WITH BLOWER SYSTEM HAVING DUAL OPPOSITE OUTLETS FOR INFORMATION HANDLING SYSTEMS," invented by Qinghong He et al., and assigned to the assignee hereof.

FIELD OF THE DISCLOSURE

The present disclosure generally relates to a method and apparatus for blower or impeller systems for movement of air with efficient size occupancy. In particular, the present disclosure relates to combined blower and impeller systems for use with a cooling module in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, and networking systems. Information handling systems can also implement various virtualized architectures. Data communications among information handling systems may be via networks that are wired, wireless, optical or some combination. Further, powerful graphics system may be desirable for use with current applications even for information handling systems have limited internal space to house components or for information handling systems requiring thin profiles such as mobile information handling systems. Components within information handling systems performing various functions may need to be designed for implementation in many form factors requiring variation to maintain space efficiency. The various components, such as a processor or graphics system, may generate heat that may require dissipation. Air movement via a fan system or other cooling system may be used to alleviate heat build-up within an information handling system. Previous systems, such as shown in FIG. 2, were inefficiently bulky. The present disclosure describes an efficient blower and impeller system which may be used as part of a thermal control system for an information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 10A is a top view of an information handling system with a dual opposite combined blower and impeller system according to an embodiment of the present disclosure;

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality. The information handling system can include memory (volatile (e.g. random-access memory, etc.), non-volatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

Figure 2:
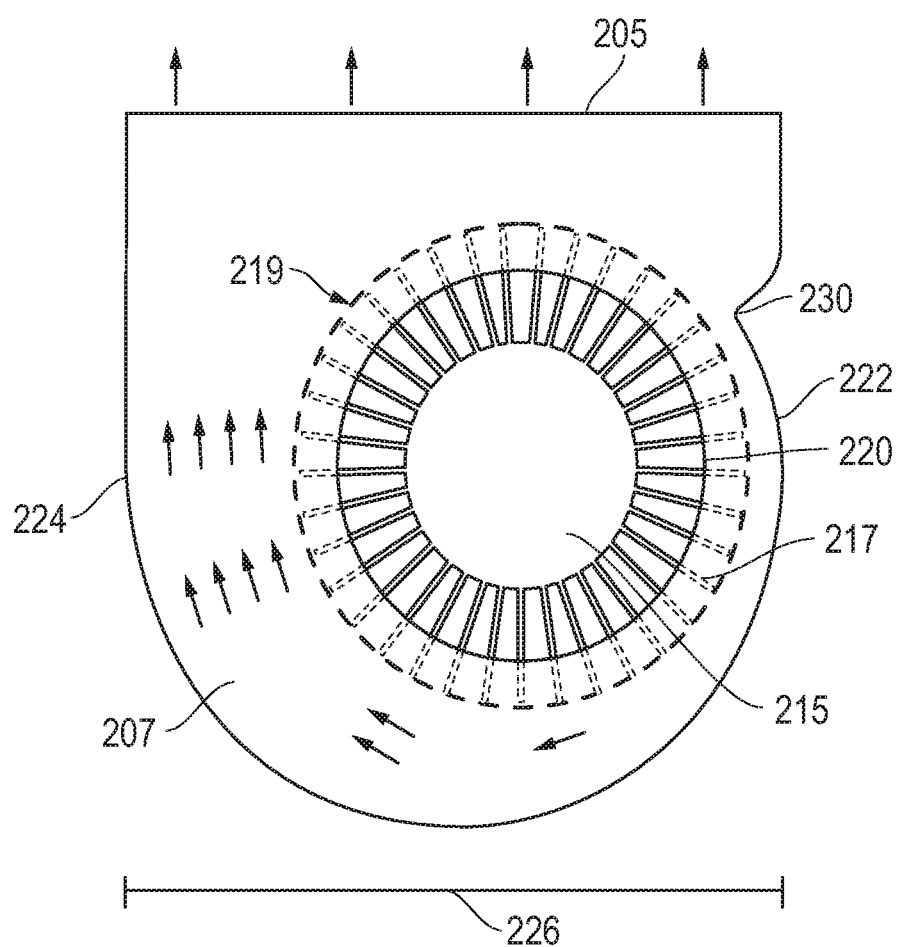
FIG. 2 is a top view of a blower system.

Several information handling system components may generate heat. As a result, thermal management of information handling systems is important while at the same time size and weight as well as electrical efficiency of information handling systems must also be balanced. In particular, some information handling system components may produce heat at a level that a need may exist to apply direct cooling measures to maintain performance or reduce risk. For example, CPUs and GPUs as well as power components frequency generate substantial heat within information handling system chassis. Other components as well are heat producing. As a result, heat sink cold plates may be thermally coupled to one or more heat producing information handling system components in various embodiments. Fin stacks may be used operatively coupled to or formed as part of a heat sink cold plate to increase surface area for heat dissipation. Additionally, heat pipes may be used to draw heat from a cold plate for dissipation across different locations within or external to the information handling system chassis. For example, heat pipe may draw heat from a cold plate thermally coupled to a heat producing information handling system component to one or more fin stacks or other heat exchangers located remote to the cold plate. Other heat exchange techniques are also contemplated for heat dissipation including liquid cooling, vapor chambers, or other systems for transferring heat to a heat exchanger. For example, vapor chambers may include heat-conductive material plates with a fluid encapsulated between the plates in a vapor chamber that may transition between a liquid phase and a gas phase to better absorb or conduct heat. However, in some information handling systems, such as those with high performance processing needs, chassis cavity heat build-up may still be excessive and may limit effectiveness of heat dissipation methods. Air movement may be needed to improve heat exchanger function. In some aspects, coupling a heat exchanger to a blower may substantially improve heat dissipation via that heat exchanger and provide for exhausting warmed air from a chassis cavity while drawing cooler air to the heat exchanger. However, previous air movement fan systems, such as shown in FIG. 2, were inefficiently bulky. Additional performance, or improved chassis space occupancy savings, or some combination is available with an efficient combination blower and impeller system which may be used as part of a thermal control system for management of heat producing components in an information handling system. A dual opposite combined blower and impeller system utilized with at least one heat exchanger operatively coupled to an outlet on the blower side or the impeller side may produce greater airflow across one or more heat exchangers, or occupy less space while providing airflow to the heat exchanger, or some combination according to various embodiments disclosed herein. In other embodiments, the dual opposite combined blower and impeller system of the present embodiments may be utilized with single heat exchanger operatively coupled to either a blower outlet or the impeller outlet on the impeller side while the other outlet may generate airflow within the general chassis cavity, toward heat producing components, or at an exhaust vent of an information handling system while producing similar or greater airflow across the heat exchanger, occupying less space, or some combination according to various embodiments disclosed herein.

Further, while a dual opposite outlet blower system of related applications to the present application may provide for greater airflow from the dual outlets similar to the presently described dual opposite combined blower and impeller system, the dual opposite combined blower and impeller system of the presently described embodiments provides additional benefits. The dual nature of the blower side and impeller side of the presently described embodiments for a dual opposite combined blower and impeller system provides options of high pressure and higher airflow directed via a blower side as with the related application while also providing for an impeller side airflow. The impeller side airflow permits greater airflow volume and greater airflow spread to be achieved from the air movement caused by the powered blower fan while still maintaining greater efficiency of size and air movement over previous blower systems. For example, the previous dual opposite outlet blower system of the related applications provided higher pressure airflow options and directionality of airflow from the outlet apertures that is useful in information handling system having higher air impedance characteristics within an information handling system chassis cavity. With the impeller side of the dual opposite combined blower and impeller system of the present embodiments, airflow from the curvilinear impeller aperture may provide greater dispersed airflow spread in the plane of rotation of the blower fan as well as greater airflow volume. While the impeller side may not provide as high a pressure as the blower side, the greater airflow volume or greater airflow directionality spread may be more suited for information handling system chassis cavities having lower air impedance characteristics.

Figure 1:
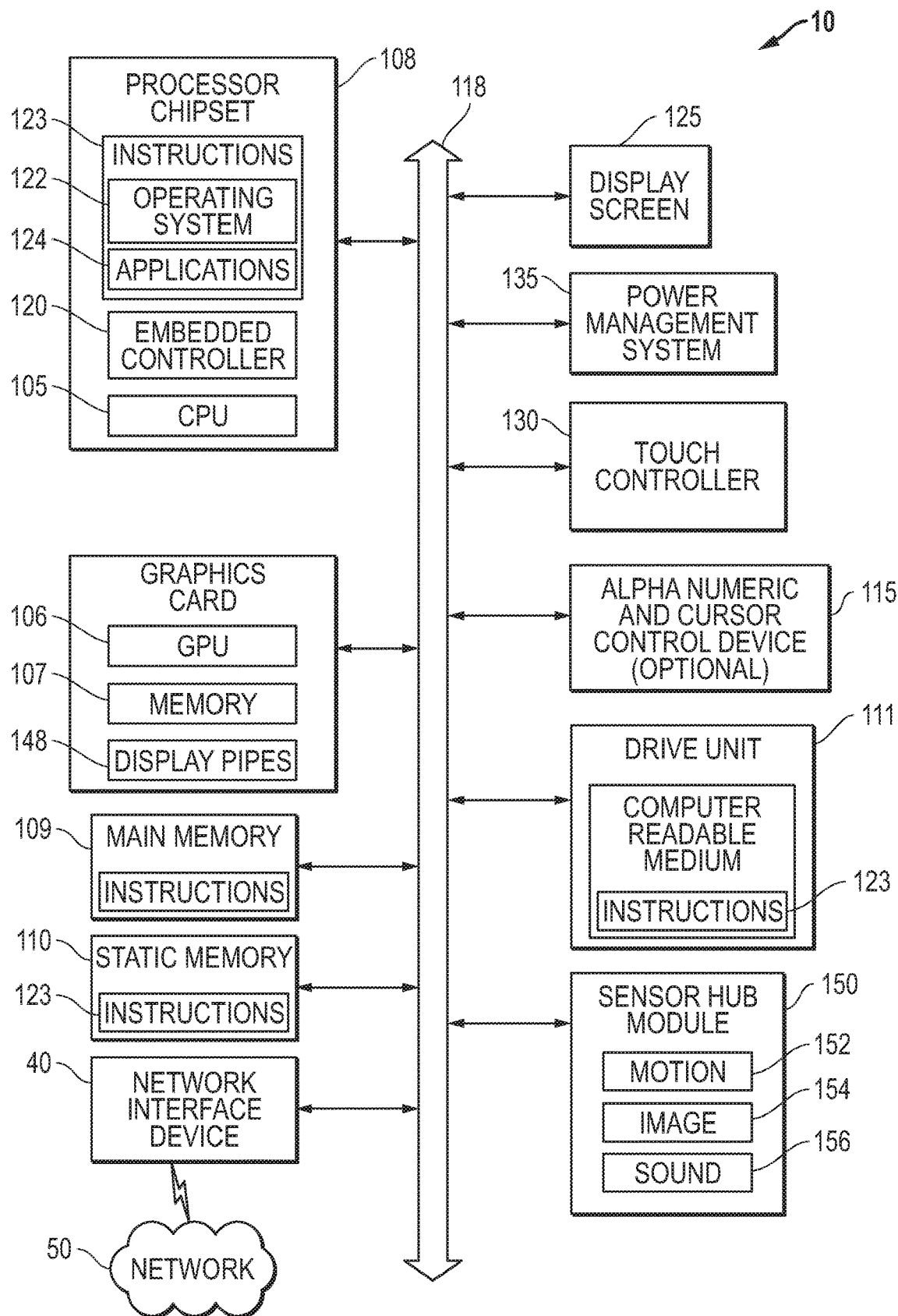
FIG. 1 is a block diagram illustrating an information handling system according to an embodiment of the present disclosure.

FIG. 1 shows an information handling system 10 capable of administering several of the embodiments of the present disclosure. The information handling system 10 can represent information handling systems utilizing dual opposite combination blower and impeller systems such as embodiments shown in FIGS. 3-10 and implementation of the embodiments described in FIGS. 11A and 11B and FIG. 12. Information handling system 10 may represent an information handling system such as a mobile information handling system with graphics processing capabilities. A mobile information handling system may execute instructions via a processor for a plurality of application programs and operating systems as understood. Information handling system 10 may also represent a networked server or other system. The information handling system 10 may include a processor such as a central processing unit (CPU) 105, a graphics processing unit (GPU) 106, or both. Moreover, the information handling system 10 can include a main memory 109 and a static memory 110 that can communicate with each other via a bus 118.

Channels or data lanes for various digital display data communication standards including bus architectures such as PCIe or display data interface standards such as DisplayPort (DP), or eDP. Such standards may be used for communications between the CPU 105 and GPU 105 as a bus 118 for chipset communications.

As shown, the information handling system 10 may further include a video display 125 and in some embodiments a second display screen or more display screens. Display screen 125 may be of a variety of display devices, such as a liquid crystal display (LCD), an organic light emitting diode (OLED), a flat panel display, a solid state display, or a cathode ray tube (CRT). Display 125 may include one or more touch screen display modules and touch screen controllers 130 for receiving user inputs to the information handling system 10. In the case of information handling systems with flat panel display systems including LCD or OLED displays, it is desirable to minimize a thickness of the information handling system while maximizing the power of the graphics display system to accommodate, for example, a large size of the display(s) on the surface of the information handling system. In some cases, mobile information handling systems may have very limited thickness in a chassis to accommodate the display, motherboard, and a separate graphics board for enhanced graphics processing power or performance. Thus, the thickness or "Z" dimension space may be very limited for internal components and may particularly be limited according to current systems for linking a motherboard and distinct graphics board. In particular, for high performance information handling systems may generate heat, especially via processing systems such as CPU 105 and GPU 106. A shared heat pipe system may be employed or two separate heat pipes may be used for the CPU 105 and GPU 106. A heat pipe with complex bends may be less efficient and more costly to manufacture. Multiple heat pipes may increase costs of an information handling system as well. Capability to locate fin stacks for cooling almost anywhere within a chassis of an information handling system provides for advantageous design options to reduce complexity and cost or to provide flexibility in location of components. Moreover, an efficiently sized blower system with beneficial air moving capacity may contribute to an overall savings in space or improve performance of an information handling system.

Additionally, the information handling system 10 may include an input device 115, such as a keyboard, and a cursor control device, such as a mouse or touchpad or similar peripheral input device. The information handling system may include a power source such as battery or an A/C power source that may be managed by a power management system 135. The information handling system 10 can also include a disk drive unit 111, and a signal generation device such as a speaker or remote control or other device (not shown). The information handling system 10 can include a network interface device 40 such as a wired adapter or a wireless adapter or similar wireless radio system to accommodate a variety of wireless communication protocols. The information handling system 10 can also represent a server device whose resources can be shared by multiple client devices, or it can represent an individual client device, such as a desktop personal computer, a laptop computer, a tablet computer, a mobile smartphone, or a wearable computing device.

The information handling system 10 can include a set of instructions 123 that can be executed to cause the computer system to perform any one or more computer-based functions. Set of instructions 123 may be stored in non-volatile storage media such as with static memory 110 or drive unit 111. Various software modules comprising application instructions 124 or other sets of instructions 123 may be coordinated by an operating system (OS) 122 and via an application programming interface (API). An example operating system may include Windows®, Android®, and other OS types known in the art. Example APIs may include Win 32, Core Java API, or Android APIs. In a further example, processor 105 may conduct processing of sets of instructions in software, firmware, hardware or any combination of the same to achieve functions understood to be performed by the information handling system 10 according to disclosures herein. Further one or more embedded controllers 120 may also be included in the chipset, on the motherboard, or in the graphics board to provide for additional processing or execution of instructions in addition to processing conducted by the CPU 105 or GPU 106 as understood in some embodiments. The computer system 10 may operate as a standalone device or may be connected such as using a network, to other computer systems or peripheral devices.

In a networked deployment, the information handling system 10 may operate in the capacity of a server or as a client user computer in a server-client user network environment, or as a peer computer system in a peer-to-peer (or distributed) network environment. The information handling system 10 can also be implemented as or incorporated into various devices, such as a personal computer (PC), a tablet PC, a set-top box (STB), a PDA, a mobile information handling system, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 10 can be implemented using electronic devices that provide voice, video, or data communication. Further, while a single information handling system 10 is illustrated, the term "system" shall also be taken to include any collection of systems or sub-systems that individually or jointly execute a set, or multiple sets, of instructions to perform one or more computer functions.

The static memory 110 or disk drive unit 111 may include a computer-readable medium in which one or more sets of instructions 123 such as software that can be embedded or stored. For example, applications 124 may include software instructions stored as sets of instructions 123 in static memory 110 or disk drive 111. Similarly, main memory 109 and static memory 110 may also contain computer-readable medium for storage of one or more sets of instructions, parameters, or profiles 123 such as operating system 122 or applications 124. The disk drive unit 111 and static memory 110 also contains space for data storage. Further, the instructions 123 may embody one or more of the methods or logic for applications, such as 124, that operate on the information handling system to display graphical content for example. Additionally, instructions relating to the various software algorithms and data may be stored here. The instructions, parameters, and profiles 123 may reside completely, or at least partially, within the main memory 109, the static memory 110, and/or within the disk drive 111 during execution by the processor 105 of information handling system 10. As explained, some or all the software, firmware or hardware instructions may be executed locally or remotely. The main memory 109 and the processor 105 also may include computer-readable media. In an example embodiment, instructions 123 or application 124 may include a thermal management system for control of active cooling measures or shut down or reduction in activity of components of the information handlings system. As part of that thermal management system, instructions 123 or an application 124 may control blower fan operation of the dual opposite combined blower and impeller system of embodiments described herein.

The network interface device 40, such as a wireless adapter, can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. Wireless adapter 40 may include one or more radio frequency subsystems with transmitter/receiver circuitry, wireless controller circuitry, amplifiers and other circuitry for wireless communications. Each radiofrequency subsystem may communicate with one or more wireless technology protocols. The wireless adapter 40 may also include antenna system which may be tunable antenna systems in some embodiments.

The wireless adapter 40 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. Wireless adapter 120 may connect to any combination of macro-cellular wireless connections including 2G, 2.5G, 3G, 4G, 5G or the like from one or more service providers. The wireless adapter 40 can represent an add-in card, wireless network interface module that is integrated with a main board of the information handling system or integrated with another wireless network interface capability, or any combination thereof. In an embodiment the wireless adapter 40 may include one or more radio frequency subsystems including transmitters and wireless controllers for connecting via a multitude of wireless links. The radio frequency subsystems include wireless controllers to manage authentication, connectivity, communications, power levels for transmission, buffering, error correction, baseband processing, and other functions of the wireless adapter 40. The wireless adapter 40 may also connect to the external network via a WPAN, WLAN, WWAN or similar wireless switched Ethernet connection. The wireless data communication standards set forth protocols for communications and routing via access points, as well as protocols for a variety of other operations.

In some embodiments, dedicated hardware implementations such as application specific integrated circuits, programmable logic arrays and other hardware devices can be constructed to implement one or more of the applications operating on the information handling system 10. Applications that may include the apparatus and systems of various embodiments can broadly include a variety of electronic and computer systems. One or more embodiments may implement functions using two or more specific interconnected hardware modules or devices with related control and data signals that can be communicated between and through the modules, or as portions of an application-specific integrated circuit.

In accordance with various embodiments of the present disclosure, the applications executed by the information handling system may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions, parameters, and profiles 123 or receives and executes instructions, parameters, and profiles 123 responsive to a propagated signal; so that a device connected to a network 50 can communicate voice, video or data over the network 50. Further, the instructions 123 may be transmitted or received over the network 50 via the network interface device or wireless adapter 40.

In other aspects, computer-readable medium that includes instructions, parameters, and profiles 123 or receives and executes instructions, parameters, and profiles 123, such as from applications 124 or OS 122, responsive to a propagated signal may communicate digital display data or instructions. Digital display data may eventually be propagated to the graphic board and GPU 106 for processing via the GPU 106, graphics memory 107 and distributed via display pipes to one or more display screens 125 in some embodiments.

Information handling system 10 includes one or more application programs 124, and Basic Input/Output System and firmware (BIOS/FW) code. BIOS/FW code functions to initialize information handling system 10 on power up, to launch an operating system 122, and to manage input and output interactions between the operating system and the other elements of information handling system 10. In a particular embodiment, BIOS/FW code resides in memory 109, and includes machine-executable code that is executed by processor 105 to perform various functions of information handling system 10. In another embodiment, application programs 124 as a part of various instructions 123 and BIOS/FW code reside in another storage medium of information handling system 10. For example, application programs and BIOS/FW code can reside in drive 111, in a ROM (not illustrated) associated with information handling system 10, in an option-ROM (not illustrated) associated with various devices of information handling system 10, in storage system 109, static memory 110, in a storage system (not illustrated) associated with network channel of a wireless adapter 40, in another storage medium of information handling system 10, in display memory 107 in parts or in any combination thereof. Application programs 124 and BIOS/FW code can each be implemented as single programs, or as separate programs carrying out the various features as described herein.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

FIG. 2 illustrates a top view of a conventional blower system. The blower system includes a housing with side walls 222 and 224 and which surrounds a blower fan 215 with fan blades 217. The conventional blower system housing is depicted such that internal fan blades may be shown at their full diameter 219 within the blower case which has a second diameter 226. Air intake comprises a circular hole 220 which draws air down into the blower case by fan 215. As fan blades 217 pass notch 230 in side wall 222, the fan 215 may increase air pressure. Space 207 inside the fan housing opposite of notch 230 allows for air flow volume to increase such that air may be moved to outlet 205. In the shown fan blower system an inlet 220 draws air in, is compressed by blower fan 215 via spinning blades in the clockwise direction with the assistance of notch 230. Space 207 is required to provide an increase in airflow from fan 215 and air exists via outlet 205. Typically, in conventional blower fan systems of this type, the fan blade diameter 219 is optimally about 60%-70% of the fan case diameter 226. This permits air to accumulate in space 207 at the end of the pressurized area beginning at notch 230 to allow air volume to increase in space 207.

Although increasing blade size diameter can significantly increase airflow, to do so within the same diameter blower housing 226 is not effective as the air cannot easily exit the turn of the fan 215 through the pressurizing zone begun at notch 230. Space 207 is needed in conventional fan systems to allow air to escape the clockwise turning fan blades 217 to generate air volume build up to be moved out of blower outlet 205.

Figure 3A:
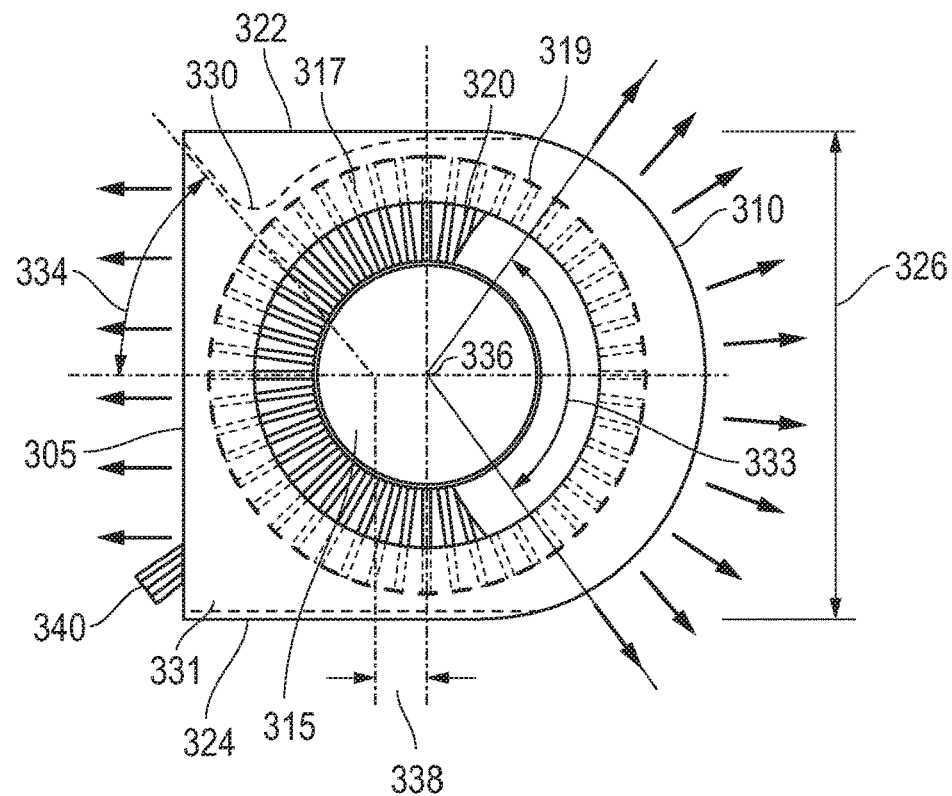
FIG. 3A is a top view of a dual opposite combined blower and impeller system according to an embodiment of the present disclosure.

FIG. 3A shows a top view of a dual opposite combined blower and impeller system according to an embodiment of the present disclosure. The dual opposite combined blower and impeller system housing with side walls 322 and 324 is depicted such that elements within the dual opposite combined blower and impeller system housing may be viewed. Dual opposite combined blower and impeller system housing may have a width Df of 326 between side walls 322 and 324. In embodiments herein, the width Df 326 between side walls 322 and 324 does not account for an inward extension of any notches such as 330 inside the dual opposite combined blower and impeller system housing, but is the inner dimension between the side walls 322 and 324 as taken across the diameter of blower fan 315. Blower fan 315 may include fan blades 317 that may rotate clockwise, from viewer perspective of FIG. 3A, about rotation axis 336 and is powered by power source 340. Power source 340 may operatively connect a fan motor (not shown) to a power management system of an information handling system and supply power from a battery power source, an alternating current power source, or other power sources in various embodiments. Further, power source 340 may include one or more control cables to control blower fan 315 on/off, fan speed, or other features of blower fan 315 from a thermal management control system which may be part of the information handling system.

Blower fan 315 may have a blade diameter Db 319 that is nearer to the described width Df 326 of dual opposite combined blower and impeller system housing between side walls 322 and 324 than conventional blower systems. In various example embodiments, the dual opposite combined blower and impeller system housing of the embodiments of the present disclosure may enable the blower fan diameter Db 319 to occupy greater than 70% of the width Df 326 of the dual opposite combined blower and impeller system housing between side walls 322 and 324. In other embodiments, the blower fan diameter Db 319 may be just short of the width Df 326 of the dual opposite combined blower and impeller system housing such that the fan blades 317 do not contact the dual opposite combined blower and impeller system housing. If the blower fan diameter Db 319 were the same as the width Df 326 of the dual opposite outlet, contact of fan blades 317 could be made with the dual opposite combined blower and impeller system housing side walls 322 or 324 presumably causing risk of damage. Thus, this limit (100%) is the limit of the diameter Db 319 of the blower fan 315 with respect to the width Df 326 of the dual opposite combined blower and impeller system housing between side walls 322 and 324 unless those side walls 322 and 324 are extended around the diameter 319 of a larger blower fan 315. In some embodiments, an extension of side walls 322 and 324 of the dual opposite combined blower and impeller system housing width 326 (not shown) may be used to accommodate a greater diameter Db 319 of the blower fan 315 and such and embodiment is also contemplated. In an example embodiment, the diameter Db 319 of blower fan 315 may occupy greater than 70% of the width Df 326 between side walls 322 and 324. In other embodiments, the diameter Db 319 of blower fan 315 may occupy greater than 85% of the width Df 326 between side walls 322 and 324 make the space occupied by the dual opposite combined blower and impeller system housing and blower fan 315 more efficient due to greater airflow improvement of the present disclosure. It is understood that blade diameter 319 applies to a fan blade system that is a generally circular component. Often however, a fan does not have a uniform external diameter dimension as it is not a perfectly round or may not be round at all. Nonetheless, the rotation of the blower fan may have a diameter that may apply as diameter Db 319 for purposes of variations on the embodiments herein.

In the example embodiment shown in FIG. 3A, blower fan 315 may include a fan hub which may rotate fan blades 317 extending from the hub. Rotation may be in the clockwise direction as shown in FIG. 3A. The fan hub may house a powered blower fan motor and other components of a blower fan 315. Other components may include the operative coupling of fan blades 317 to rotation shaft of a blower fan motor. In other embodiments, blower fan motor may be mounted below the fan hub or operatively coupled to the fan hub as understood by those of skill in design of the blower fan 315. Blower fan 315 may be subject to a variety of blower fan rotation speeds, blower fan control, as well as pitch, shape, or size of fan blades 317 according to various embodiments. Blower fan 315 may utilize a blower fan motor for example of any torque capacity and speed capacity with varied power requirements. In one example embodiment, a blower fan motor operating at 5 volts, 0.22 amps or 1.1 watts may be used, but the embodiments herein are not limited to such a blower fan motor capacity. In various embodiments and applications of the dual opposite combined blower and impeller system of the present disclosures, any level of power for blower fans may be used including from below 1 watt to much greater wattage fans. The fan blades 317 may extend from fan hub and are angled away from the direction of rotation of blower fan 315 in the example embodiment of FIG. 3A. Other embodiments of blade angle and blade shape are shown in other embodiments herein, however, any effective fan blade shape, size, angle, or pitch is contemplated and may be used to move air within the dual opposite combined blower and impeller system of the embodiments of the present disclosure.

The dual opposite combined blower and impeller system has an air intake at the aperture 320 in the facing surface of the dual opposite combined blower and impeller system housing to draw air into the dual opposite combined blower and impeller system housing in an embodiment. In other aspects, the air intake to the dual opposite combined blower and impeller system housing may be of any shape and may be situated on either face of the dual opposite combined blower and impeller system housing or even be on a side wall in some embodiments. Further, in some embodiments, the air intake may comprise plural inlets including located on any surface of the dual opposite combined blower and impeller system housing. The dual opposite combined blower and impeller system has two outlet apertures 305 and 310. One of the outlet apertures 305 is located on a blower side of the dual opposite combined blower and impeller system according to an embodiment. The other outlet aperture may be a curvilinear impeller outlet aperture 310 exposing a greater amount of the rotating diameter of the blower fan 315. As such, the curvilinear impeller outlet aperture 310 may generate airflow from the rotating blower fan in a plane of rotation at a wider airflow directional spread in various embodiments. The width of the curvilinear opening around the rotational diameter of the blower fan 315 may be designed to control the extent of airflow direction spread and this may also have an effect on airflow volume from the curvilinear impeller outlet aperture 310 in various embodiments. In some embodiments, the width of the curvilinear impeller aperture 310 may not be symmetrical between the first and second side walls 322 and 324. For example, on the sidewall near a notch 330, the sidewall may be extended further and, accordingly, the curvilinear impeller aperture 310 may be shorter on one side to provide additional air pressure build up via the notch 330 for the blower side aperture 305. Various embodiments may include multiple sizes and shapes of the curvilinear impeller aperture 310 and are contemplated with the embodiments described herein.

An airflow spread angle 333 may describe the airflow spread from the impeller portion of the dual opposite combined blower and impeller system. Where a blower portion of the dual opposite combined blower and impeller system may have a generally linear airflow, the impeller portion provides for the wider airflow directional spread. The airflow spread angle 333 may be increased in the impeller portion by greater than 15 degrees rather than a generally centerline of airflow of a blower side in some embodiments. In other embodiments, the airflow spread angle 333 may be as great as 130 degrees from the impeller side of the dual opposite combined blower and impeller system as opposed to a generally linear airflow from a blower side.

The two outlet apertures 305 and 310 may be opposite one another in one example embodiment such that the flow of air out of the dual opposite combined blower and impeller system housing may happen in generally opposite directions. In one example embodiment, the dual opposite combined blower and impeller system may have outlet air movement out of the dual opposite combined blower and impeller system housing in generally opposite directions in a plane of rotation of the blower fan 315. Generally opposite directions of air movement may be anywhere from approximately 120 degrees to approximately 240 degrees in opposite directions not necessarily accounting for the aspect of the curvilinear impeller aperture 310 having a wider airflow directional spread with an airflow spread angle 333 anywhere from 15 degrees increase airflow spread up to 130 degrees airflow spread. It is understood that some additional airflow characteristics are possible depending on the dual opposite combined blower and impeller system and nearby components or chassis in the information handling system. Several degrees outside of the above or below either range is contemplated for some embodiments. The orientation of the outlets relative to each other depends on the desired air flow, air pressure, or air volume that is developed before the next output is reached. If one outlet is less than 120 degrees from the other, the development of airflow and pressure is minimal which limits its usefulness in real application however it still may be a functional embodiment contemplated within the present disclosure for example. Other embodiments, described below, show that the dual outlet apertures may have varied shapes or sizes including one or more curved outlet zones to provide greater airflow out and a wider array of directions from the dual opposite combined blower and impeller system housing.

The dual opposite combined blower and impeller system of FIG. 3A and the present disclosure may include a single notch 330 in side wall 322 or may have no notch in the side walls in some embodiments. In other embodiments, two notches, a first notch 330 in side wall 322 and a second notch (not shown) in side wall 324 may be used. If a notch, or extension into the rotational plane of blower fan 315, is used, then the notch 330 may be a curvilinear shape inside of side wall 322 internal to the dual opposite combined blower and impeller system housing in one example embodiment. The notch 330 shown curves from side wall 322 such that it forms a notch angle A 334. The curvilinear shape may increase inward along the side wall 322 in the direction of rotation (clockwise as depicted) of the blower fan 315 at notch angle A. The curvilinear shape of the notch 330 then recedes to follow the shape of the circumference of the fan 315 with blades 317. The notch angle A 334 may be anywhere from 30 to 70 degrees depending upon a notch offset L 338 which is offset from an axis of rotation 336 of fan 315 in some optimized embodiments. In other embodiments as described in some embodiments herein, 0 degrees to 90 degrees may be used. There may be no notches 330 as shown in an embodiment below, or the notch 330 may be of a variety of shapes including angled, pointed, squared off at 90 degrees, or the like in various embodiments. The notch angle A 334 and notch offset L 338 may define the shape and how far notch 330 extends from side wall 322. Further differing shapes of the notch 330 or notches may provide less or greater resistance and air pressurization capability for fan 315 within the dual opposite combined blower and impeller system housing or may yield additional noise whereby a shape or notch size may be determined based upon such factors. Other notch shapes are contemplated for the notches, such as 330, including angled notches with pointed extensions or rounded extensions, rounded notches, wavy notches, or notches of a variety of shapes or contours. In other embodiments, rotation of the fan blades may be counter-clockwise instead of clockwise as shown. Such reversed direction of the rotation of the blower fan 315 may result in changed placement of notches, such as 330, along sidewalls 322 or 325 in some embodiments.

It may be noted with the dual opposite combined blower and impeller system of FIG. 3A, the fan diameter 319 may occupy substantially larger portion of the width of dual opposite combined blower and impeller system housing 326 than previously available blower fan systems used with information handling systems. It has been found that an increase of 15% to 55% of fan size is possible compared with conventional blower fans such that the fan and blade diameter Db may be anywhere from approximately 70% to just less than the width of the dual opposite combined blower and impeller system housing. Blade diameter Db less than 70% will also work in some embodiments with the dual opposite outlet blower design. Embodiments with blade diameter DB as low as 60% are contemplated for the various dual opposite combined blower and impeller systems of the embodiments herein. With the dual opposite combined blower and impeller system, air is not trapped within the pressurization area formed starting, for example from notch 330 as the fan rotates clockwise in FIG. 3A. Areas 331 works along with the nearby areas of outlet apertures 305 respectively to provide air volume build up space without a need to maintain additional dual opposite combined blower and impeller system housing width as with conventional fan systems. In testing, it was found that the dual opposite combined blower and impeller system may provide substantial increases in both airflow and pressure compared to a conventional blower system. Having a half blower and half impeller design of the present embodiments of the dual opposite combined blower and impeller system trades-off some airflow pressure on the impeller side relative to the dual opposite outlet blower system of related applications, but still generates greater airflow and pressure as well as volume for the width of dual opposite combined blower and impeller system housing compared to previous blower systems. Moreover, the impeller side provides for improved airflow volume and wider airflow directionality spread that may be beneficial with certain information handling system chassis layouts such as those with lower airflow impedance.

In one example testing environment with similar fan case width and thickness, similar fan hub diameter, and similar fan speed, the dual opposite combined blower and impeller system having a fan blade diameter approximately 85% of the dual opposite combined blower and impeller system housing width compared to a conventional fan system having a fan blade diameter at or below 70% of the fan case width could produce more than double the maximum airflow and 50% greater maximum air pressure generated when similar housing width and fan speed were tested. Thus, improvement in function of the dual opposite combined blower and impeller system for moving air may be obtained without sacrificing size or chassis occupancy by the dual opposite combined blower and impeller system housing within an information handling system. In another aspect, the same level of function for moving air for thermal management may be achieved by a smaller form dual opposite combined blower and impeller housing than a contemporary blower fan freeing up space within the information handling system chassis for other components to occupy or providing further flexibility in layout and location of components within a chassis of an information handling system.

Figure 3B:
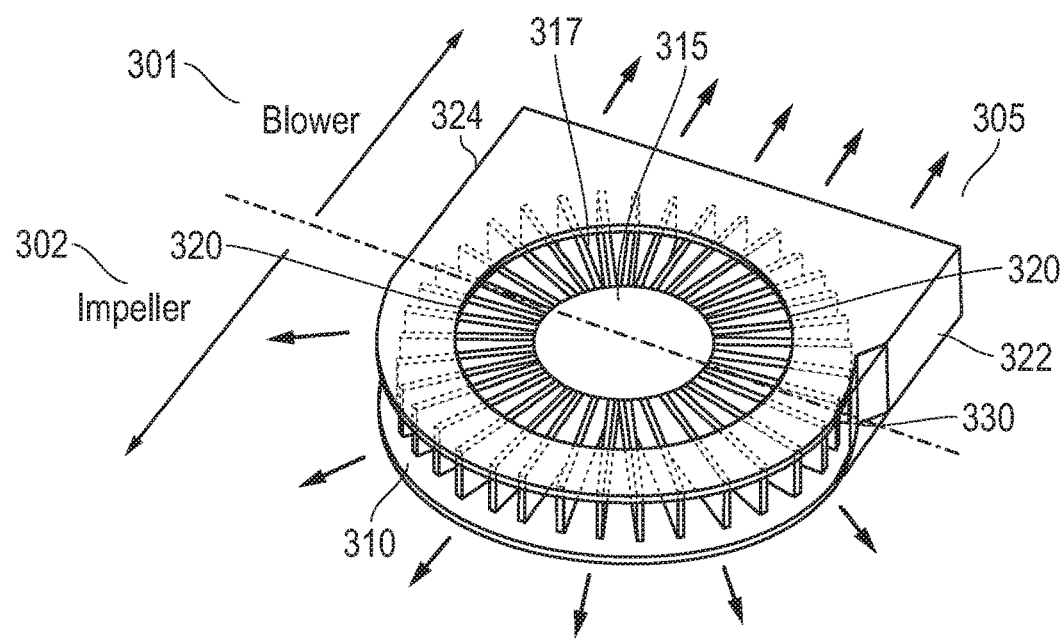
FIG. 3B is a perspective view of a dual opposite combined blower and impeller system according to an embodiment of the present disclosure.

FIG. 3B shows a perspective view of a dual opposite combined blower and impeller system, similar to the embodiment of FIG. 3A, according to an embodiment of the present disclosure. Again, dual opposite combined blower and impeller system housing with side walls 322 and 324 is depicted such that elements within the dual opposite combined blower and impeller system housing may be viewed internally. Dual opposite combined blower and impeller system has two parts, a blower side 301 with a blower outlet aperture 305 and an impeller side 302 with a curvilinear impeller outlet 310. Dual opposite combined blower and impeller system housing may have a width Df between side walls 322 and 324 such that the width Df is the width of the dual opposite combined blower and impeller system housing as taken across the diameter Db of blower fan 315 according to an embodiment. In the example, the width Df of the dual opposite combined blower and impeller system housing does not include the internal protrusion of side wall notch 330. Blower fan 315 may include a blower fan hub and fan blades 317 extending from the fan hub that may rotate clockwise about a rotation axis in the shown embodiment. Counterclockwise rotation is also contemplated for variations on the shown embodiment. Blower fan 315 is powered by power source (not shown) which may power and control a blower fan motor. The power source may be operatively connected to a power management system of an information handling system and supply power from a battery power source, an alternating current power source, or other power sources to a blower fan motor (not shown) in various embodiments. The power source may also include one or more control lines as well as power source lines to blower fan 315. Control of operation, speed, duration and other operational aspects of the dual opposite combined blower and impeller system may be managed from a thermal management system operating in BIOS or another application via the CPU or via a controller managing power or thermal controls.

Blower fan 315 may have a blade diameter Db that is nearer to the width Df of dual opposite combined blower and impeller system housing between side walls 322 and 324 than previous blower systems as described. In various example embodiments, the dual opposite combined blower and impeller system housing of the embodiments of the present disclosure may enable the blower fan diameter Db to occupy greater than 70% of the width Df of the dual opposite combined blower and impeller system housing between side walls 322 and 324. In other embodiments, the blower fan diameter Db may be just short of the width Df of the dual opposite combined blower and impeller system housing such that the fan blades 317 do not contact the dual opposite combined blower and impeller system housing. If the blower fan diameter Db were the same as the width Df of the dual opposite outlet, contact between fan blades 317 and the dual opposite combined blower and impeller system housing side walls 322 or 324 presumably may cause risk of damage. Thus, this limit (<100%) is the limit of the diameter Db of the blower fan 315 with respect to the width of the dual opposite combined blower and impeller system housing between side walls 322 and 324. In some embodiments, an extension of side walls 322 and 324 to accommodate a greater diameter Db of the blower fan 315 as described in other embodiments herein.

In the example embodiment shown in FIG. 3B, the fan blades 317 extend from the fan hub linearly from the blower fan 315 hub. In other embodiments, the fan blades 317 may be angled away from or toward the direction of rotation of blower fan 315 depending on desired airflow production characteristics and noise requirements. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite combined blower and impeller system has an air inlet at the aperture 320 in the facing surface of the dual opposite combined blower and impeller system housing to draw air into the dual opposite combined blower and impeller system housing in an embodiment. In other aspects, the air inlet to the dual opposite combined blower and impeller system housing may be plural air inlet apertures or may be of any shape and may be situated on either face of the dual opposite combined blower and impeller system housing or even include an air inlet aperture to be on a side wall in some embodiments. The dual opposite combined blower and impeller system has two outlet apertures, blower outlet aperture 305 and curvilinear impeller outlet aperture 310. The two outlet apertures may be opposite one another in one example embodiment such that the flow of air out of the dual opposite combined blower and impeller system housing may happen in generally opposite directions.

In one example embodiment, the dual opposite combined blower and impeller system may have outlet air movement at anywhere from 120 degrees to 240 degrees in opposite directions. However, as can be seen in the shown embodiment, the curvilinear impeller outlet aperture 310 provides for a directional airflow spread affording greater airflow volume and a spread of airflow in a wider area from the plane of rotation of blower fan 315 than a blower outlet aperture such as 305. In an example embodiment, the curvilinear impeller outlet aperture 310 may provide an airflow spread angle greater than 15 degrees in directional airflow spread from one side of the curvilinear impeller outlet aperture 310 along side wall 322 to the other side wall 324. The width of the curvilinear impeller outlet aperture 310 between side walls 322 and 324 may determine the angular range of the directional airflow spread angle generally provided although some additional airflow current may occur along sides of the spread. This airflow spread angle is described further and shown with respect to FIG. 3A. In other embodiments, the curvilinear impeller outlet aperture 310 may provide greater than 30 degrees in directional airflow spread angle for example. In yet other embodiments, the curvilinear impeller outlet aperture 310 may provide greater than 45 degrees in directional airflow spread angle. It is contemplated that the width of the curvilinear impeller outlet aperture 310 may be sized to provide any angular range in directional airflow spread with the understanding that reduced side wall sizes for 322 and 324 in the plane of rotation of blower fan 315 may have impacts on pressure generation capabilities at the blower outlet aperture 305 or the curvilinear impeller outlet aperture 310 in various embodiments.

The dual opposite combined blower and impeller system of FIG. 3B and the present disclosure may include one or more notches, such as notch 330 extending internally from side wall 322. In other embodiments, no notches may be used along either side wall 322 or 324. In yet other embodiments, a second notch may extend internally from side wall 324. As described in various embodiments, the notches may be of a variety of shapes depending on pressure or volume characteristics of the generated airflow desired or cost of manufacture. Further, size or shape of notches, such as 330 may impact noise generation by the dual opposite combined blower and impeller system. In an example embodiment, notch 330 may curve from outlet apertures 305 along side wall 322 in a curvilinear shape may increase along the side wall 322 in the direction of rotation (clockwise as depicted) of the blower fan 315 and then recede to follow the shape of the circumference of the fan 315 with blades 317. The notch 330 is at least partially in the plane of rotation of the blower fan 315. The notch angle A may be anywhere from 30 to 70 degrees and may also depend upon a notch offset L which is offset from an axis of rotation of fan 315 as described in herein. The notch 330 may extend from side walls 322 and 324 to varying degrees in some embodiments to determine the level of generated air pressure desired or to determine allowable levels of noise during operation. Design of the extension of notch 330 around the blower fan 315 blade diameter may involve various considerations among tradeoffs between air flow, air pressurization, and operational noise such that notch 330 may vary in size or shape in multiple variations on the embodiments herein. Notch 330 may be of a variety of shapes in addition to curvilinear such as angled, pointed, rounded, wavy, or other shapes according to embodiments herein.

Figure 3C:
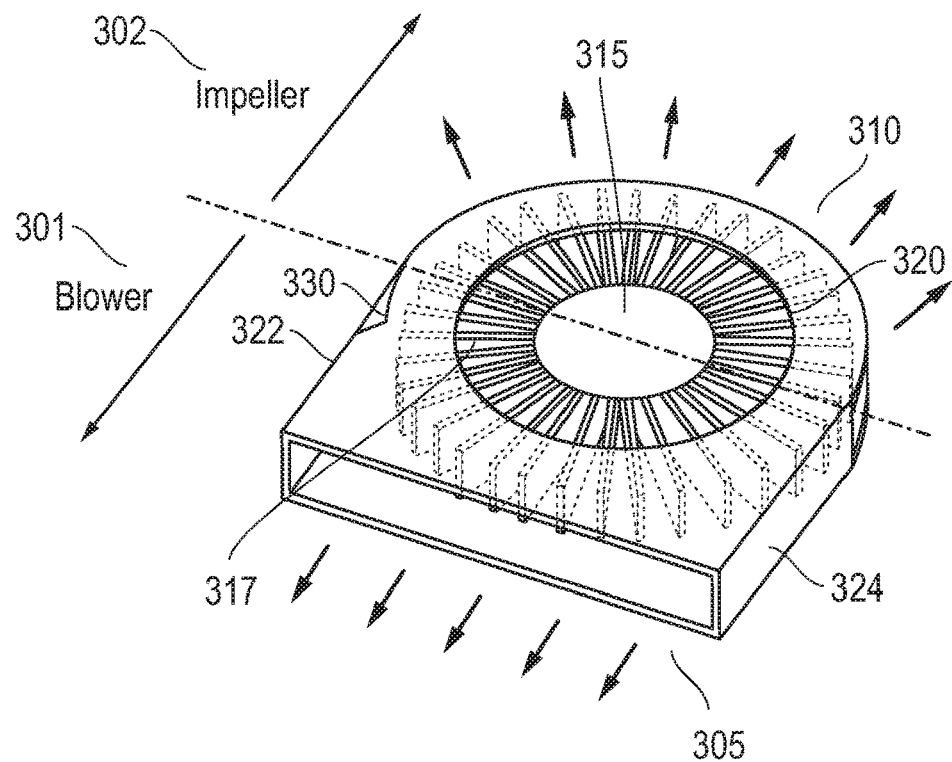
FIG. 3C is another perspective view of a dual opposite combined blower and impeller system according to an embodiment of the present disclosure.

FIG. 3C shows another perspective view of a dual opposite combined blower and impeller system, similar to the embodiments of FIG. 3A and FIG. 3B, according to an embodiment of the present disclosure. Again, dual opposite combined blower and impeller system housing with side walls 322 and 324 is depicted such that elements within the dual opposite combined blower and impeller system housing may be viewed internally. Dual opposite combined blower and impeller system has two parts, a blower side 301 with a blower outlet aperture 305 and an impeller side 302 with a curvilinear impeller outlet 310. FIG. 3C shows the blower side 301 from a front perspective view for illustration of embodiments herein. Dual opposite combined blower and impeller system housing may have a width Df between side walls 322 and 324 such that the width Df is the width of the dual opposite combined blower and impeller system housing as taken across the diameter Db of blower fan 315 according to an embodiment. In the example, the width Df of the dual opposite combined blower and impeller system housing does not include the internal protrusion of side wall notch 330. Blower fan 315 may include a blower fan hub and fan blades 317 extending from the fan hub that may rotate clockwise about a rotation axis in the shown embodiment. Counterclockwise rotation is also contemplated for variations on the shown embodiment. Blower fan 315 is powered by power source (not shown) which may power and control a blower fan motor. The power source may be operatively connected to a power management system of an information handling system and supply power from a battery power source, an alternating current power source, or other power sources to a blower fan motor (not shown) in various embodiments. The power source may also include one or more control lines as well as power source lines to blower fan 315. Control of operation, speed, duration and other operational aspects of the dual opposite combined blower and impeller system may be managed from a thermal management system operating in BIOS or another application via the CPU or via a controller managing power or thermal controls.

Blower fan 315 may have a blade diameter Db that is nearer to the width Df of dual opposite combined blower and impeller system housing between side walls 322 and 324 than previous blower systems as described with respect to embodiments herein such as greater than greater than 70% of the width Df of the dual opposite combined blower and impeller system housing up to just short of the width Df of the dual opposite combined blower and impeller system housing. In some embodiments, an extension of side walls 322 and 324 to accommodate a greater diameter Db of the blower fan 315 as described in other embodiments herein.

In the example embodiment shown in FIG. 3C, the fan blades 317 extend from the fan hub linearly from the blower fan 315 hub and axis of rotation. In other embodiments, the fan blades 317 may be angled away from or toward the direction of rotation of blower fan 315 depending on desired airflow production characteristics and noise requirements. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite combined blower and impeller system has an air inlet at the aperture 320 in the facing surface of the dual opposite combined blower and impeller system housing to draw air into the dual opposite combined blower and impeller system housing in an embodiment. In other aspects, the air inlet to the dual opposite combined blower and impeller system housing may be plural air inlet apertures or may be of any shape and may be situated on either face of the dual opposite combined blower and impeller system housing or even include an air inlet aperture to be on a side wall such as 322 or 324 in some embodiments. The dual opposite combined blower and impeller system has two outlet apertures, blower outlet aperture 305 and curvilinear impeller outlet aperture 310. The two outlet apertures may be opposite one another in one example embodiment such that the flow of air out of the dual opposite combined blower and impeller system housing may happen in generally opposite directions.

As with various embodiments herein, the dual opposite combined blower and impeller system may have outlet air movement at anywhere from 120 degrees to 240 degrees in opposite directions. However, as can be seen in the shown embodiment, the curvilinear impeller outlet aperture 310 provides for a directional airflow spread affording greater airflow volume and a spread of airflow in a wider area in the plane of rotation of blower fan 315 than a blower outlet aperture such as 305. In an example embodiment, the curvilinear impeller outlet aperture 310 may provide greater than 15 degrees in directional airflow spread angle from one side of the curvilinear impeller outlet aperture 310 along side wall 322 to the other side wall 324. The width of the curvilinear impeller outlet aperture 310 between side walls 322 and 324 may determine the angular range of directional airflow spread angle generally provided although some additional airflow current may occur along sides of the spread. In other embodiments, the curvilinear impeller outlet aperture 310 may provide greater than 30 degrees in directional airflow spread angle although substantially greater airflow spread is also contemplated depending upon the use scenario for the dual opposite combined blower and impeller system. It is contemplated that the width of the curvilinear impeller outlet aperture 310 may be sized to provide any angular range in directional airflow spread angle with the understanding that reduced side wall sizes for 322 and 324 in the plane of rotation of blower fan 315 may have impacts on pressure generation capabilities at the blower outlet aperture 305 or the curvilinear impeller outlet aperture 310 in various embodiments. This airflow spread angle is described further and shown with respect to FIG. 3A.

The dual opposite combined blower and impeller system of FIG. 3C and the present disclosure may include one or more notches, such as notch 330 extending internally from side wall 322. In other embodiments, no notches may be used along either side wall 322 or 324. In yet other embodiments, a second notch may extend internally from side wall 324. As described in various embodiments, the notches may be of a variety of shapes depending on pressure or volume characteristics of the generated airflow desired or cost of manufacture. Further, size or shape of notches, such as 330 may impact noise generation by the dual opposite combined blower and impeller system as described with various embodiments herein. Design of the extension of notch 330 around the blower fan 315 blade diameter may involve various considerations among tradeoffs between air flow, air pressurization, and operational noise such that notch 330 may vary in size or shape in multiple variations on the embodiments herein. Notch 330 may be of a variety of shapes in addition to curvilinear such as angled, pointed, rounded, wavy, or other shapes according to embodiments herein.

Figure 3D:
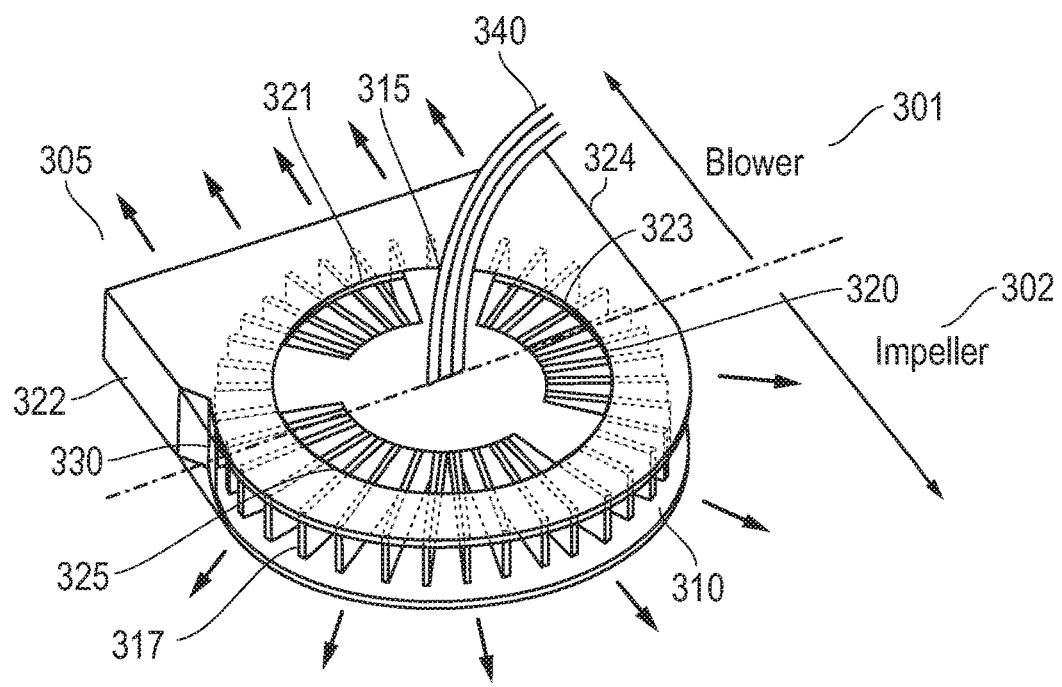
FIG. 3D is another perspective view of a dual opposite combined blower and impeller system with plural inlets according to an embodiment of the present disclosure.

FIG. 3D shows a perspective view of a dual opposite combined blower and impeller system which is a variation to the embodiment of FIG. 3A according to an embodiment of the present disclosure. Again, dual opposite combined blower and impeller system housing has side wall 322 and 324 with a width Df between side walls 322 and 324 such that the width Df is the width of the dual opposite combined blower and impeller system housing as taken across the diameter Db of blower fan 315 including the extension of fan blades 317 rotating around a fan hub according to an embodiment. In the example, the width Df of the dual opposite combined blower and impeller system housing does not include the internal protrusion of side wall notches, such as 330 seen through blower outlet 305. The fan blades 317 extend from the fan hub and are straight extensions away from the blower fan 315 hub, but other embodiments of blade angle and blade shape are contemplated such that any effective fan blade shape, size, angle or pitch is contemplated and may be used to move air within the dual opposite outlet blower of the embodiments within the present disclosure.

Blower fan 315 is powered by power source 340 which may power and control a blower fan motor. Power source 340 may be operatively connected to a power management system of an information handling system and supply power from a battery power source, an alternating current power source, or other power sources to a blower fan motor (not shown) in various embodiments. Power source 340 may also include one or more control lines to blower fan 315.

Blower fan 315 may have a blade diameter Db that is nearer to the width Df of dual opposite combined blower and impeller system housing between side walls 322 and 324 as described. In various example embodiments, the dual opposite combined blower and impeller system housing of the embodiments of the present disclosure may enable the blower fan diameter Db to occupy greater than 70% of the width Df of the dual opposite combined blower and impeller system housing between side walls 322 and 324. In other embodiments, the blower fan diameter Db may be just short of the width Df of the dual opposite combined blower and impeller system housing such that the fan blades 317 do not contact the dual opposite combined blower and impeller system housing. Variations of the housing and notches, such as an extension of side walls 322 and 324 to accommodate a greater diameter Db of the blower fan 315, are contemplated in view of various embodiments herein.

The dual opposite combined blower and impeller system has a plurality of air inlets at the apertures 321, 323, and 325 in the facing surface of the dual opposite combined blower and impeller system housing to draw air into the dual opposite combined blower and impeller system housing in an embodiment. In other aspects, the air inlet or inlets 321, 323, and 325 to the dual opposite combined blower and impeller system housing may be of any shape and may be situated on either face of the dual opposite combined blower and impeller system housing or even include an air inlet aperture to be on a side wall in some embodiments. In the presently shown embodiment, the plural air inlets 321, 323, and 325 are shown on a facing surface sharing the power source lines 340. The shown facing surface in the embodiment of FIG. 3D may be the surface of the housing on which the blower fan 315 may be mounted in an embodiment.

The dual opposite combined blower and impeller system has a blower side and an impeller side. The blower side has an outlet aperture 305 and the impeller side has an impeller aperture 310 as with other embodiments. The two outlet apertures may be opposite one another in one example embodiment such that the flow of air out of the dual opposite combined blower and impeller system housing may happen in generally opposite directions.

In one example embodiment, the dual opposite combined blower and impeller system may have outlet air movement at anywhere from 120 degrees to 240 degrees in opposite directions. However, as can be seen in the shown embodiment, the curvilinear impeller outlet aperture 310 provides for a directional airflow spread affording greater airflow volume and a spread of airflow in a wider area from the plane of rotation of blower fan 315 than a blower outlet aperture such as 305. In an example embodiment, the curvilinear impeller outlet aperture 310 may provide greater than 15 degrees in directional airflow spread angle from one side of the curvilinear impeller outlet aperture 310 along side wall 322 to the other side wall 324. The width of the curvilinear impeller outlet aperture 310 between side walls 322 and 324 may determine the angular range of directional airflow spread angle generally provided although some additional airflow current may occur along sides of the spread as described with embodiments herein. In other embodiments, the curvilinear impeller outlet aperture 310 may provide greater than 30 degrees in directional airflow spread angle. In yet other embodiments, the curvilinear impeller outlet aperture 310 may provide greater than 45 degrees in directional airflow spread angle. This airflow spread angle is described further and shown with respect to FIG. 3A. It is contemplated that the width of the curvilinear impeller outlet aperture 310 may be sized to provide any angular range in directional airflow spread angle with the understanding that reduced side wall sizes for 322 and 324 in the plane of rotation of blower fan 315 may have impacts on pressure generation capabilities at the blower outlet aperture 305 or the curvilinear impeller outlet aperture 310 in various embodiments. The dual opposite combined blower and impeller system of FIG. 3D may operate similarly to several embodiments herein to cause air volume and pressure to be forced to exit both outlets 305 and 310.

Figure 3E:
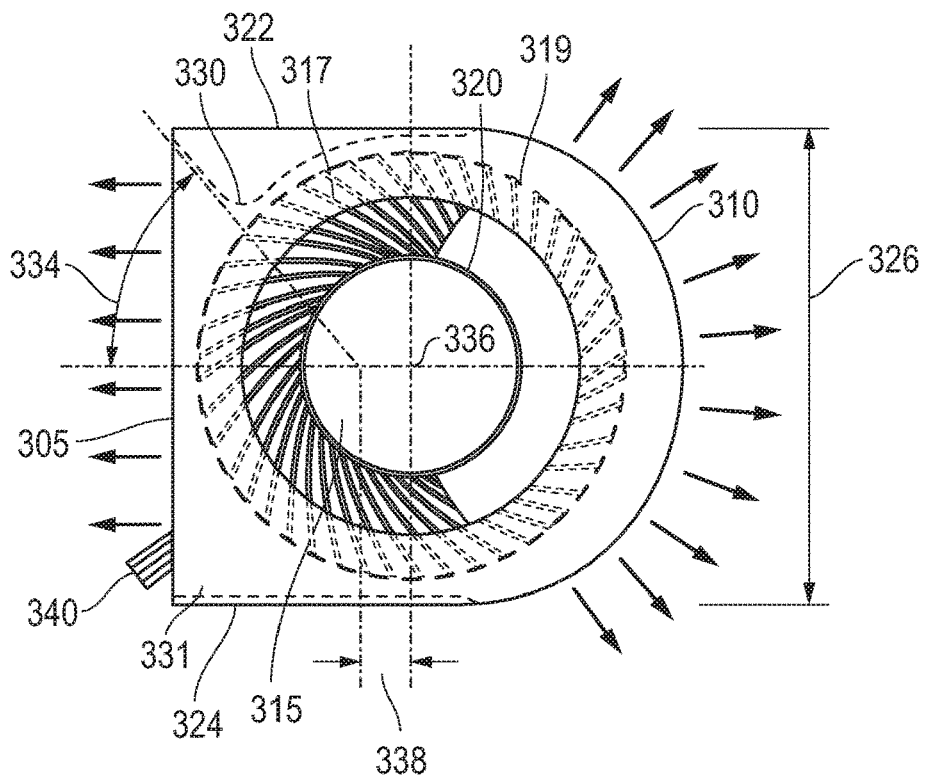
FIG. 3E is a top view of a dual opposite combined blower and impeller system according to an embodiment of the present disclosure.

FIG. 3E shows a top view of a dual opposite combined blower and impeller system which is a variation to the embodiment of FIG. 3A according to an embodiment of the present disclosure. In this particular embodiment, a clockwise fan rotation may be used and FIG. 3E depicts a blower fan 315 with angled fan blades 317. Again, dual opposite combined blower and impeller system housing has side wall 322 and 324 with a width Df between side walls 322 and 324 such that the width Df is the width of the dual opposite combined blower and impeller system housing as taken across the diameter Db of blower fan 315 including the extension of fan blades 317 rotating around a fan hub according to an embodiment. In the example, the width Df of the dual opposite combined blower and impeller system housing does not include the internal protrusion of side wall notch 330. Due to the rotation of fan 315 and blades 317, notch 330 is situated along side wall 322 in the plane of rotation of fan 315 and blades 317. The fan blades 317 extend from the fan hub and are angled away from the direction of rotation of blower fan 315, but other embodiments of blade angle and blade shape are contemplated such that any effective fan blade shape, size, angle or pitch is contemplated and may be used to move air within the dual opposite outlet blower of the embodiments within the present disclosure. For example, fan blades 317 may be angled toward the direction of rotation in some embodiments.

Blower fan 315 is powered by power source 340 which may power and control a blower fan motor. Power source 340 may also include one or more control lines to blower fan 315. Further, blower fan 315 may have a blade diameter Db that is nearer to the width Df of dual opposite combined blower and impeller system housing between side walls 322 and 324 as described in several embodiments herein.

The dual opposite combined blower and impeller system has an air inlet at aperture 320 on the facing surface however a plurality of air inlets are contemplated as described in various embodiments. Further, the air inlets may be of any shape and on either face of the dual opposite combined blower and impeller system housing or even include an air inlet aperture to be on a side wall in some embodiments.

The dual opposite combined blower and impeller system has a blower side with a blower outlet apertures 305 and an impeller side with a curvilinear impeller outlet aperture 310 as with other embodiments. The two outlet apertures may be opposite one another in one example embodiment such that the flow of air out of the dual opposite combined blower and impeller system housing may happen in generally opposite directions. In one example embodiment, the dual opposite combined blower and impeller system may have outlet air movement at anywhere from 120 degrees to 240 degrees in opposite directions.

The curvilinear impeller outlet aperture 310 provides for a directional airflow spread affording greater airflow volume and a spread of airflow in a wider area from the plane of rotation of blower fan 315 from the impeller side than a blower outlet aperture such as 305. In an example embodiment, the width of the curvilinear impeller outlet aperture 310 between side walls 322 and 324 may determine the angular range of directional airflow spread angle generally provided although some additional airflow current may occur along sides of the spread as described with embodiments herein. It is contemplated that the width of the curvilinear impeller outlet aperture 310 may be sized according to embodiments herein to provide any angular range in directional airflow spread angle with the understanding that reduced side wall sizes for 322 and 324 in the plane of rotation of blower fan 315 may have impacts on pressure generation capabilities at the blower outlet aperture 305 or the curvilinear impeller outlet aperture 310 in various embodiments. This airflow spread angle is described further and shown with respect to FIG. 3A. The dual opposite combined blower and impeller system of FIG. 3E may operate similarly to several embodiments herein to cause air volume and pressure to be forced to exit both outlets 305 and 310.

Figure 3F:
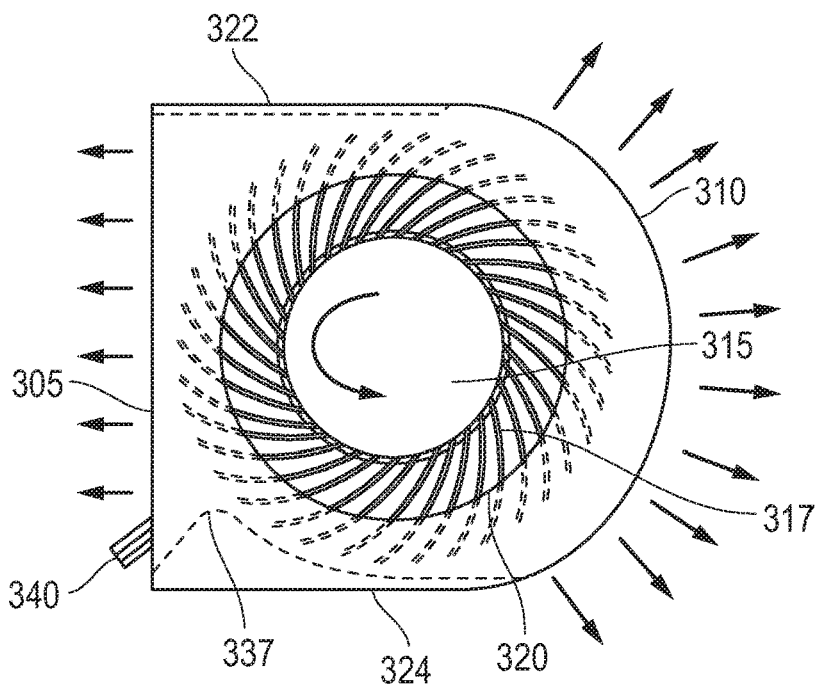
FIG. 3F is a top view of a dual opposite combined blower and impeller system with counterclockwise fan rotation according to an embodiment of the present disclosure.

FIG. 3F shows a top view of a dual opposite combined blower and impeller system which is a variation to the embodiment of FIG. 3A according to an embodiment of the present disclosure. In this particular embodiment, a counterclockwise fan rotation may be used. Again, dual opposite combined blower and impeller system housing has side wall 322 and 324 with a width Df between side walls 322 and 324 such that the width Df is the width of the dual opposite combined blower and impeller system housing as taken across the diameter Db of blower fan 315 including the extension of fan blades 317 rotating around a fan hub according to an embodiment. In the example, the width Df of the dual opposite combined blower and impeller system housing does not include the internal protrusion of side wall notch 337. Due to the opposite rotation of fan 315 and blades 317, notch 337 is situated in a different location along side wall 324 respectively relative to fan 315 and blades 317. The fan blades 317 extend from the fan hub and are angled away from the direction of rotation of blower fan 315, but other embodiments of blade angle and blade shape are contemplated such that any effective fan blade shape, size, angle or pitch is contemplated and may be used to move air within the dual opposite outlet blower of the embodiments within the present disclosure. For example, blades 317 may be angled toward the direction of rotation of blower fan 315 in some embodiments.

Blower fan 315 is powered by power source 340 which may power and control a blower fan motor. Power source 340 may also include one or more control lines to blower fan 315. Further, blower fan 315 may have a blade diameter Db that is nearer to the width Df of dual opposite combined blower and impeller system housing between side walls 322 and 324 as described in several embodiments herein.

The dual opposite combined blower and impeller system has an air inlet at aperture 320 on the facing surface however a plurality of air inlets are contemplated as described in various embodiments. Further, the air inlets may be of any shape and on either face of the dual opposite combined blower and impeller system housing or even include an air inlet aperture to be on a side wall in some embodiments. The dual opposite combined blower and impeller system has a blower side with a blower outlet apertures 305 and an impeller side with a curvilinear impeller outlet 310 as with other embodiments. The two outlet apertures may be opposite one another in one example embodiment such that the flow of air out of the dual opposite combined blower and impeller system housing may happen in generally opposite directions. In one example embodiment, the dual opposite combined blower and impeller system may have outlet air movement at anywhere from 120 degrees to 240 degrees in opposite directions.

The curvilinear impeller outlet aperture 310 provides for a directional airflow spread affording greater airflow volume and a spread of airflow in a wider area from the plane of rotation of blower fan 315 from the impeller side than a blower outlet aperture such as 305. In an example embodiment, the width of the curvilinear impeller outlet aperture 310 between side walls 322 and 324 may determine the angular range of directional airflow spread angle generally provided although some additional airflow current may occur along sides of the spread as described with embodiments herein. It is contemplated that the width of the curvilinear impeller outlet aperture 310 may be sized according to embodiments herein to provide any angular range in directional airflow spread angle with the understanding that reduced side wall sizes for 322 and 324 in the plane of rotation of blower fan 315 may have impacts on pressure generation capabilities at the blower outlet aperture 305 or the curvilinear impeller outlet aperture 310 in various embodiments. This airflow spread angle is described further and shown with respect to FIG. 3A. The dual opposite combined blower and impeller system of FIG. 3F may operate similarly to several embodiments herein to cause air volume and pressure to be forced to exit both outlets 305 and 310.

Figure 4:
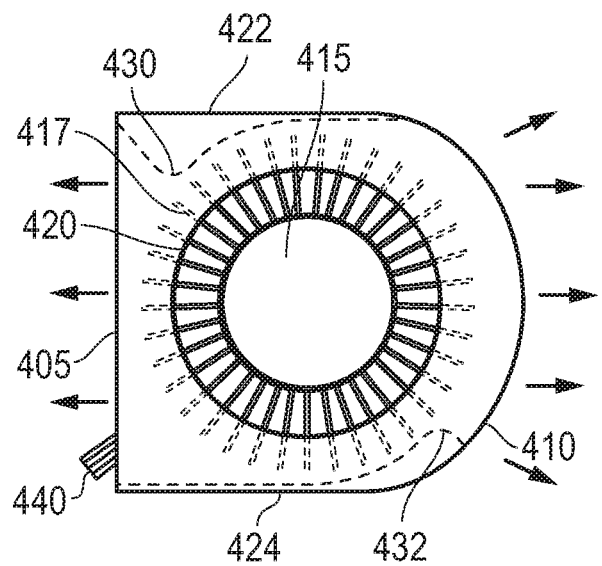
FIG. 4 is a top view of a dual opposite combined blower and impeller system according to another embodiment of the present disclosure.

FIG. 4 shows a top view of a dual opposite combined blower and impeller system according to another embodiment of the present disclosure. Again, a dual opposite combined blower and impeller system housing with side walls 422 and 424 is depicted such that elements within the dual opposite combined blower and impeller system housing may be viewed internally. Dual opposite combined blower and impeller system housing may have a width Df between side walls 422 and 424 in an example embodiment such that the width Df is the width of the dual opposite combined blower and impeller system housing as taken across the diameter Db of blower fan 415 according to an embodiment. In an example, the width Df of the dual opposite combined blower and impeller system housing does not include the internal protrusion of side wall notch 430 or 432. Blower fan 415 may include a blower fan hub and fan blades 417 extending from the fan hub that may rotate clockwise about a rotation axis. Blower fan 415 is powered by power source 440 which may power and control a blower fan motor. Power source 440 may be operatively connected to a power management system of an information handling system and supply power from a battery power source, an alternating current power source, or other power sources to a blower fan motor (not shown) in various embodiments. Power source 440 may also include one or more control lines to blower fan 415.

Blower fan 415 may have a blade diameter Db that is nearer to the described width Df of dual opposite combined blower and impeller system housing between side walls 422 and 424 than previous blower systems. In various example embodiments, the dual opposite combined blower and impeller system housing of the embodiments of the present disclosure may enable the blower fan diameter Db to occupy greater than 70% of the width Df of the dual opposite combined blower and impeller system housing between side walls 422 and 424. As described in embodiments herein the fan and blade diameter Db may be anywhere from 70% to just less than the width of the dual opposite combined blower and impeller system housing. With the dual opposite combined blower and impeller system, air is not trapped within the pressurization area formed along side wall notch 430 as the fan rotates clockwise due to the open areas by the blower outlet aperture 405 and the curvilinear impeller aperture 410 on either side of the blower fan 415 in its plane of rotation. Accordingly, improvement in function of the dual opposite combined blower and impeller system for moving air over previous blower systems may be obtained without sacrificing size or chassis occupancy by the dual opposite combined blower and impeller system housing within an information handling system.

In the example embodiment shown in FIG. 4, the fan blades 417 extend from the fan hub and are angled away from the direction of rotation of blower fan 415. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite combined blower and impeller system housing of FIG. 4 includes a notch 430 extending internally from side wall 422 in one embodiment. In another embodiment, the dual opposite combined blower and impeller system illustrated in FIG. 4 may include a notch 432 along side wall 424. It is understood that either or both notches 430 or 432 may be included in various embodiments of the dual opposite combined blower and impeller system described herein.

Notches 430 and 432 may be a curvilinear shape inside of side walls 422 and 424 internal to the dual opposite combined blower and impeller system housing. The notch 430 curves from outlet aperture 405 along side wall 422 such that it forms a notch angle A as described with respect to FIG. 3A. The curvilinear shape may increase and then decrease along the side wall 424 in the direction of rotation (clockwise as depicted) of the blower fan 415 such that it may follow the shape of the circumference of the fan 415 with blades 417. The notch angle A may be anywhere from 30 to 70 degrees and also depend upon a notch offset L which is offset from an axis of rotation of fan 415. The notch 432 may curve internally from an edge of blower outlet 410 along side wall 424 according to various curves and internal protrusion distances according to embodiments herein as well. The notches 430 and 432 may extend from side walls 422 or 424 to varying degrees in some embodiments to determine the level of generated air pressure desired or to determine allowable levels of noise during operation. Design of the extension of notch 430 around the blower fan 415 blade diameter may be a tradeoff between greater resistance and air pressurization capability for the dual opposite combined blower and impeller system versus operational noise. Notches 430 or 432 may be of a variety of shapes in addition to curvilinear such as angled, pointed, rounded, wavy, or other shapes according to other embodiments herein.

The dual opposite combined blower and impeller system has an air inlet at the aperture 420 in the facing surface of the dual opposite combined blower and impeller system housing to draw air into the dual opposite combined blower and impeller system housing in an embodiment. In other aspects, the air intake to the dual opposite combined blower and impeller system housing may be plural air inlet apertures or may be of any shape. The air inlet aperture 420 may be situated on either face of the dual opposite combined blower and impeller system housing or even include an air inlet aperture to be on a side wall in some embodiments. The dual opposite combined blower and impeller system has a blower side including a blower outlet aperture 405 and an impeller side including a curvilinear impeller outlet aperture 410. The two outlets may be opposite one another in one example embodiment such that the flow of air out of the dual opposite combined blower and impeller system housing may happen in generally opposite directions. In one example embodiment, the dual opposite combined blower and impeller system may have outlet air movement at anywhere from 120 degrees to 240 degrees in opposite directions. In the current embodiment of FIG. 4, the dual outlet apertures may have varied shapes. The embodiment of FIG. 4 has at least one curved impeller outlet aperture outlet zone to provide a wider directionality to airflow out from the blower outlet aperture depicted in FIG. 3A for example. As with embodiments described herein, the impeller side of the dual opposite combined blower and impeller system of embodiments herein may have a curvilinear impeller outlet aperture 410. The curvilinear impeller outlet aperture 410 provides for a directional airflow spread affording greater airflow volume and a spread of airflow in a wider area from the plane of rotation of blower fan 415 from the impeller side than a blower outlet aperture such as 405, even with curved impeller outlet zone. In an example embodiment, the width of the curvilinear impeller outlet aperture 410 between side walls 422 and 424 may determine the angular range of directional airflow spread angle generally provided although some additional airflow current may occur along sides of the spread as described with embodiments herein. It is contemplated that the width of the curvilinear impeller outlet aperture 410 may be sized according to embodiments herein to provide any angular range in directional airflow spread angle with the understanding that reduced side wall sizes for 422 and 424 in the plane of rotation of blower fan 415 may have impacts on pressure generation capabilities at the blower outlet aperture 405 or the curvilinear impeller outlet aperture 410 in various embodiments. This airflow spread angle is described further and shown with respect to FIG. 3A. The dual opposite combined blower and impeller system of FIG. 4 may operate similarly to several embodiments herein to cause air volume and pressure to be forced to exit both outlets 405 and 410.

Figure 5:
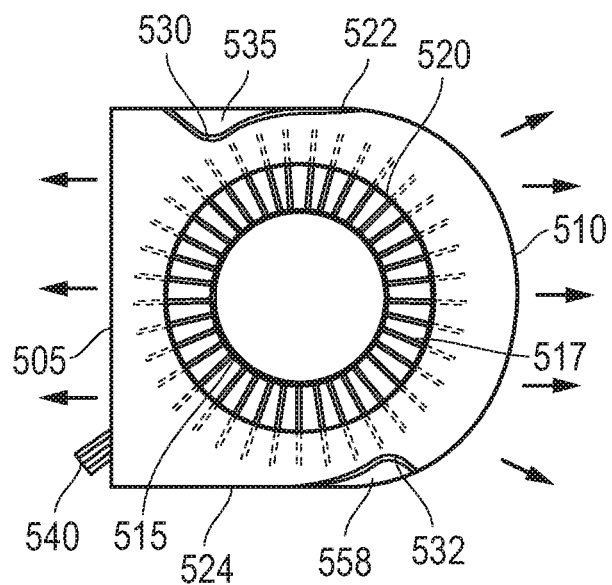
FIG. 5 is a top view of a dual opposite combined blower and impeller system according to another embodiment of the present disclosure.

FIG. 5 shows a top view of a dual opposite combined blower and impeller system according to another embodiment of the present disclosure. FIG. 5 is similar to embodiments described above and is depicted such that elements within the dual opposite combined blower and impeller system housing may be viewed internally. The dual opposite combined blower and impeller system includes a blower fan 515 and a dual opposite combined blower and impeller system housing with side walls 522 and 524, a facing surface including an air inlet at aperture 520 to draw air into the dual opposite combined blower and impeller system housing in an embodiment. In the shown embodiment, a notch 530 is shown as formed from a curvilinear shape of sidewall 522. The dual opposite combined blower and impeller system has a blower side including a blower outlet aperture 505 and an impeller side including a curvilinear impeller outlet aperture 510. The two outlet apertures may be opposite one another in a plane of rotation of blower fan 515 in one example embodiment such that the flow of air out of the dual opposite combined blower and impeller system housing may happen in generally opposite directions. In one example embodiment, the dual opposite combined blower and impeller system may have outlet air movement at anywhere from 120 degrees to 240 degrees in opposite directions. In various embodiments, the dual outlet apertures may have varied shapes and sizes including various widths or thicknesses. Similarly, the air intake to the dual opposite combined blower and impeller system housing may be plural air inlet apertures, may be of any shape, or may be disposed on either face of the dual opposite combined blower and impeller system housing or even on a side wall in some embodiments as described herein.

The curvilinear impeller outlet aperture 510 provides for a directional airflow spread affording greater airflow volume and a spread of airflow in a wider area from the plane of rotation of blower fan 515 from the impeller side in the plane of rotation of fan 515 than a blower outlet aperture such as 505. In an example embodiment, the width of the curvilinear impeller outlet aperture 510 between side walls 522 and 524 may determine the angular range of directional airflow spread angle generally provided although some additional airflow current may occur along sides of the spread as described with embodiments herein. It is contemplated that the width of the curvilinear impeller outlet aperture 510 may be sized according to embodiments herein to provide any angular range in directional airflow spread angle with the understanding that reduced side wall sizes for 522 and 524 in the plane of rotation of blower fan 515 may have impacts on pressure generation capabilities at the blower outlet aperture 505 or the curvilinear impeller outlet aperture 510 in various embodiments. This airflow spread angle is described further and shown with respect to FIG. 3A. The dual opposite combined blower and impeller system of FIG. 5 may operate similarly to several embodiments herein to cause air volume and pressure to be forced to exit both outlets 505 and 510.

Fan blades 517 extend from the fan hub and are angled away from the direction of rotation of blower fan 515 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite combined blower and impeller system housing of FIG. 5 includes a notch 530 that is formed from a shape of the side wall 522 and extends internally into the dual opposite combined blower and impeller system housing. A gap 535 formed of an indentation along the exterior of side wall 522 at notch 530 shows the dual opposite combined blower and impeller system housing base in an embodiment. It is understood that only a gap 535 formed of the indentation, and no base underneath, may be present in other embodiments. A second notch 532 may be formed of the side wall 524 in other embodiments and may similarly extend internally into the dual opposite combined blower and impeller system housing and may have a gap 558. Notches 530 and 532 with gaps 535 and 558 may provide additional space in a chassis of an information handling system in some embodiments. The internal extension of the notch 530 or notches 530 and 532 of side wall 522 or 524 may vary depending on desired pressurization or noise minimization. This internal extension may be determined based on considerations described in embodiments herein including a notch angle A and an offset as described with respect to FIG. 3A. In various other embodiments, notch 530 or plural notches may be of a variety of shapes including angled, pointed, rounded, wavy, or other shaped notches according to other embodiments herein. It is understood that either or both or none of notches 530 or 532 may be included in various embodiments of the dual opposite combined blower and impeller system described herein with FIG. 5.

Blower fan 515 is powered by power source 540 which may power and control a blower fan motor. Power source 540 may be operatively connected to a power management system of an information handling system and supply power from a battery power source, an alternating current power source, or other power sources to a blower fan motor (not shown) in various embodiments. Power source 540 may also include one or more control lines to blower fan 515.

As described with various embodiments herein, the dual opposite combined blower and impeller system housing may have a width Df between side walls 522 and 524 in an example embodiment such that the width Df is the width of the dual opposite combined blower and impeller system housing as taken across the diameter Db of blower fan 515 according to an embodiment. Blower fan 515 may have a blade diameter Db that is nearer to the described width Df of dual opposite combined blower and impeller system housing between side walls 522 and 524 than previous blower systems. In various example embodiments, the dual opposite combined blower and impeller system housing of the embodiments of the present disclosure may enable the blower fan diameter Db to occupy greater than 70% of the width Df of the dual opposite combined blower and impeller system housing between side walls 522 and 524 up to just less than the width of the dual opposite combined blower and impeller system housing across the fan diameter in the plane of rotation. Accordingly, improvement in function of the dual opposite combined blower and impeller system for moving air over previous blower systems may be obtained without sacrificing size or chassis occupancy as described in the present disclosure.

Figure 6:
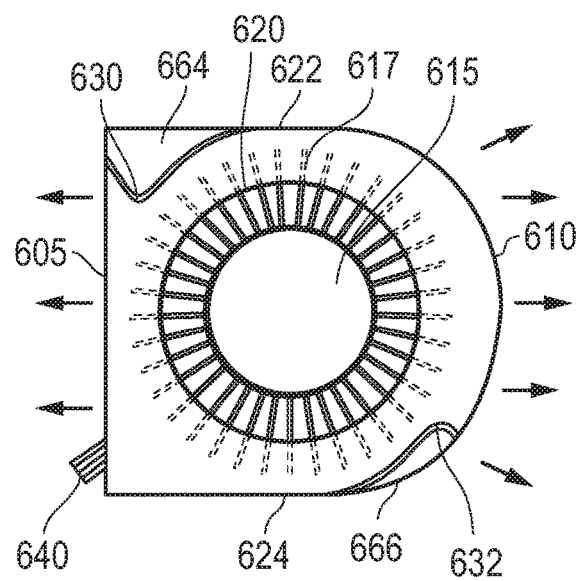
FIG. 6 is a top view of a dual opposite combined blower and impeller system according to another embodiment of the present disclosure.

FIG. 6 shows a top view of a dual opposite combined blower and impeller system according to another embodiment of the present disclosure. FIG. 6 is similar to embodiments described above and is depicted such that elements within the dual opposite combined blower and impeller system housing may be viewed internally. The dual opposite combined blower and impeller system includes a blower fan 615 and a dual opposite combined blower and impeller system housing with side walls 622 and 624, a facing surface including an air inlet at aperture 620 to draw air into the dual opposite combined blower and impeller system housing in an embodiment. The dual opposite combined blower and impeller system has a blower side and an impeller side. The blower side includes a blower outlet aperture 605. The impeller side includes a curvilinear impeller aperture 610. The two outlet apertures may be opposite one another in a plane of rotation of blower fan 615 in one embodiment such that the flow of air out of the dual opposite combined blower and impeller system housing may happen in generally opposite directions. In an example embodiment, the dual opposite combined blower and impeller system may have outlet air movement at anywhere from 120 degrees to 240 degrees in opposite directions.

The curvilinear impeller outlet aperture 610 provides for a directional airflow spread affording greater airflow volume and a spread of airflow in a wider area from the plane of rotation of blower fan 615 from the impeller side than a blower outlet aperture such as 605. In an example embodiment, the width of the curvilinear impeller outlet aperture 610 between side walls 622 and 624 may determine the angular range of directional airflow spread angle generally provided although some additional airflow current may occur along sides of the spread as described with embodiments herein. It is contemplated that the width of the curvilinear impeller outlet aperture 610 may be sized according to embodiments herein to provide any angular range, such as a 15 degree or greater degree of spread, in directional airflow spread angle with the understanding that reduced side wall sizes for 622 and 624 in the plane of rotation of blower fan 615 may have impacts on pressure generation capabilities at the blower outlet aperture 605 or the curvilinear impeller outlet aperture 610 in various embodiments. This airflow spread angle is described further and shown with respect to FIG. 3A. The dual opposite combined blower and impeller system of FIG. 6 may operate similarly to several embodiments herein to cause air volume and pressure to be forced to exit both outlets 605 and 610.

Fan blades 617 extend from the fan hub and are angled away from the direction of rotation of blower fan 615 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite combined blower and impeller system housing of FIG. 6 includes at least one notch 630 in an embodiment although plural sidewall notches are contemplated in other embodiments. Notch 630 is formed of the side wall 622 and extends internally into the dual opposite combined blower and impeller system housing. Notch 630 of side wall 622 begins a curvilinear shape at the first aperture 605 shortening its width, curves inward, and gradually recedes along the diameter of blower fan 615 in the direction of rotation of fan 615 toward curvilinear impeller outlet aperture 610. A gap 635 formed via an indentation along the exterior of side wall 622 corresponding to notch 630 shows the dual opposite combined blower and impeller system housing base underlying in an embodiment. It is understood that only a gap 635, and no exposed base underneath, may be present in some embodiments. Gap 635 may provide for additional chassis space to be made available with the dual opposite combined blower and impeller system installed. Notch 630 is formed of side wall 622 such that outlet aperture 605 is narrower than the width Df of the dual opposite combined blower and impeller system housing in the shown embodiment as taken between sidewalls 622 and 624 and accommodating the diameter Db of fan 615 and blades 617. A second notch 632 is an optional embodiment contemplated as being similarly formed of the side wall 624 in other embodiments and may extend internally into the dual opposite combined blower and impeller system housing in various embodiments. A second notch could be formed such that curvilinear impeller outlet aperture 610 is also narrower than the width Df of the dual opposite combined blower and impeller system housing. The internal extension of the notch 630 or notches 630 and 632 may vary depending on desired pressurization and noise minimization. This internal extension may be determined based on considerations described in embodiments herein including a notch angle A to a point outside of the outlet apertures 605 and 610, and an offset as described with respect to FIG. 3A. In various other embodiments, notch 630 or plural notches 630 and 632 may be of a variety of shapes including angled, pointed, rounded, wavy, or other shaped notches according to other embodiments herein. In a further embodiment, notches 630 and 632 may be indented in sidewalls 622 and 624 to form gaps 664 and 666 respectively. These gaps may provide space internal to an information handling system chassis in some embodiments. It is understood that either or both notches 630 or 632 may be included in various embodiments of the dual opposite combined blower and impeller system described herein and either, both, or neither may be included in an embodiments such as that shown in FIG. 6.

Blower fan 615 is powered by power source 640 which may power and control a blower fan motor. Power source 640 may be operatively connected to a power management system of an information handling system and supply power from a battery power source, an alternating current power source, or other power sources to a blower fan motor (not shown) in various embodiments. Power source 640 may also include one or more control lines to blower fan 615.

As described with various embodiments herein, the dual opposite combined blower and impeller system housing may have a width Df between side walls 622 and 624 in an example embodiment such that the width Df is the width of the dual opposite combined blower and impeller system housing as taken across the diameter Db of blower fan 615 according to an embodiment. Blower fan 615 may have a blade diameter Db that is nearer to the width Df of dual opposite combined blower and impeller system housing between side walls 622 and 624 as described than previous blower systems. In various example embodiments, the dual opposite combined blower and impeller system housing of the embodiments of the present disclosure may enable the blower fan diameter Db to occupy greater than 70% of the width Df of the dual opposite combined blower and impeller system housing between side walls 622 and 624 up to just less than the width of the dual opposite combined blower and impeller system housing across the fan diameter in the plane of rotation. Accordingly, improvement in function of the dual opposite combined blower and impeller system for moving air over previous blower systems may be obtained without sacrificing size or chassis occupancy as described in the present disclosure.

Figure 7:
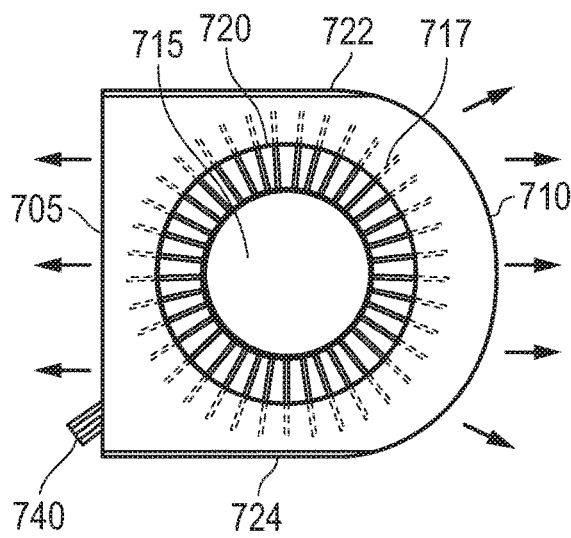
FIG. 7 is a top view of a dual opposite combined blower and impeller system according to another embodiment of the present disclosure.

FIG. 7 shows a top view of a dual opposite combined blower and impeller system according to another embodiment of the present disclosure. FIG. 7 is similar to embodiments described above and is depicted such that elements within the dual opposite combined blower and impeller system housing may be viewed internally. The dual opposite combined blower and impeller system includes a blower fan 715 and a dual opposite combined blower and impeller system housing with side walls 722 and 724, a facing surface including an air inlet at aperture 720 to draw air into the dual opposite combined blower and impeller system housing in an embodiment. The dual opposite combined blower and impeller system has a first blower side including a blower outlet aperture 705 and a second impeller side including a curvilinear impeller outlet aperture 710. The two outlet apertures may be opposite one another in a plane of rotation of blower fan 715 in one embodiment such that the flow of air out of the dual opposite combined blower and impeller system housing may happen in generally opposite directions. In an example embodiment, the dual opposite combined blower and impeller system may have outlet air movement at anywhere from 120 degrees to 240 degrees in opposite directions. In various embodiments, the dual outlet apertures may have varied shapes and sizes including various widths or thicknesses. Similarly, the air inlet 720 to the dual opposite combined blower and impeller system housing may be plural air inlet apertures, may be of any shape, or may be disposed on either face of the dual opposite combined blower and impeller system housing or even on a side wall in some embodiments as described herein.

The curvilinear impeller outlet aperture 710 provides for a directional airflow spread affording greater airflow volume and a spread of airflow in a wider area in the plane of rotation of blower fan 715 from the impeller side than a blower outlet aperture such as 705. In an example embodiment, the width of the curvilinear impeller outlet aperture 710 between side walls 722 and 724 may determine the angular range of directional airflow spread angle generally provided although some additional airflow current may occur along sides of the spread as described with embodiments herein. It is contemplated that the width of the curvilinear impeller outlet aperture 710 may be sized according to embodiments herein to provide any angular range, such as a 15 degree or greater degree of spread, in directional airflow spread angle with the understanding that reduced side wall sizes for 722 and 724 in the plane of rotation of blower fan 715 may have impacts on pressure generation capabilities at the blower outlet aperture 705 or the curvilinear impeller outlet aperture 710 in various embodiments. This airflow spread angle is described further and shown with respect to FIG. 3A. The dual opposite combined blower and impeller system of FIG. 7 may operate similarly to several embodiments herein to cause air volume and pressure to be forced to exit both outlets 705 and 710.

Fan blades 717 extend from the fan hub and are angled away from the direction of rotation of blower fan 715 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite combined blower and impeller system housing of FIG. 7 has no notches in side walls 722 and 724 in the shown embodiment. Having no notches may not provide as much of a pressurization zone along side walls 722 and 724 in the plane of rotation of blower fan 715 comparatively with a similar blower fan 715, however a close proximity and tolerance between the diameter Db of the blower fan 715 including fan blades 717 and side walls 722 and 724 may still generate sufficient air pressure in an embodiment to force air to blower outlet aperture 905 as well as curvilinear impeller outlet aperture 710. Such a dual opposite combined blower and impeller system without notches may be a cost saving aspect to allow less expensive manufacturing costs of the dual opposite combined blower and impeller system.

Blower fan 715 is powered by power source 740 which may power and control a blower fan motor. Power source 740 may be operatively connected to a power management system of an information handling system and supply power from a battery power source, an alternating current power source, or other power sources to a blower fan motor (not shown) in various embodiments. Power source 740 may also include one or more control lines to blower fan 715.

As described with various embodiments herein, the dual opposite combined blower and impeller system housing may have a width Df between side walls 722 and 724 in an example embodiment such that the width Df is the width of the dual opposite combined blower and impeller system housing as taken across the diameter Db of blower fan 715 according to an embodiment. Blower fan 715 may have a blade diameter Db that is nearer to the width Df of dual opposite combined blower and impeller system housing between side walls 722 and 724 as described than previous blower systems. In various example embodiments, the dual opposite combined blower and impeller system housing of the embodiments of the present disclosure may enable the blower fan diameter Db to occupy greater than 70% of the width Df of the dual opposite combined blower and impeller system housing between side walls 722 and 724 up to just less than the width of the dual opposite combined blower and impeller system housing across the fan diameter in the plane of rotation. Accordingly, improvement in function of the dual opposite combined blower and impeller system for moving air over previous blower systems may be obtained without sacrificing size or chassis occupancy as described in the present disclosure.

Figure 8:
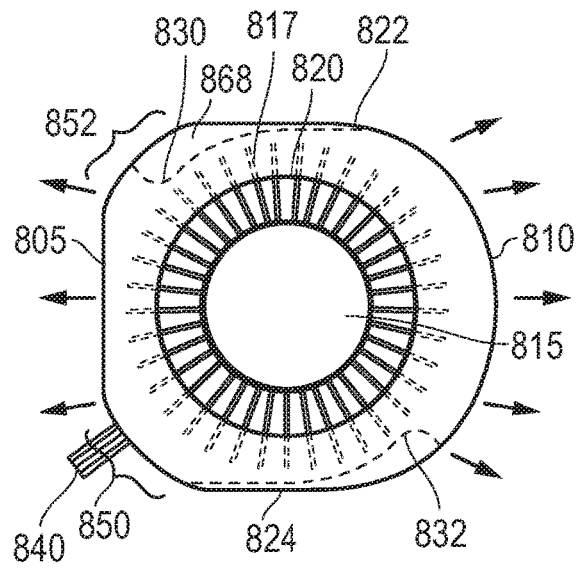
FIG. 8 is a top view of a dual opposite combined blower and impeller system according to another embodiment of the present disclosure.

FIG. 8 shows a top view of a dual opposite combined blower and impeller system according to another embodiment of the present disclosure. FIG. 8 is similar to embodiments described above and is depicted such that elements within the dual opposite combined blower and impeller system housing may be viewed internally. The dual opposite combined blower and impeller system includes a blower fan 815 and a dual opposite combined blower and impeller system housing with side walls 822 and 824, a facing surface including an air inlet at aperture 820 to draw air into the dual opposite combined blower and impeller system housing in an embodiment. The dual opposite combined blower and impeller system has two sides, a blower side and an impeller side. The blower side includes a blower outlet aperture 805. The impeller side includes a curvilinear impeller outlet aperture 810. In the shown embodiment, the blower outlet aperture may be expanded with curved regions 850 and 852 to provide a wider airflow spread similar to that of the curvilinear impeller outlet aperture 810, however not as wide of an airflow spread. The two outlet apertures may be opposite one another in a plane of rotation of blower fan 815 in one embodiment such that the flow of air out of the dual opposite combined blower and impeller system housing may happen in generally opposite directions. In an example embodiment, the dual opposite combined blower and impeller system may have outlet air movement at anywhere from 120 degrees to 240 degrees in opposite directions. In various embodiments, the dual outlet apertures may have varied shapes and sizes including various widths or thicknesses. Similarly, the air inlet 820 to the dual opposite combined blower and impeller system housing may be plural air inlet apertures, may be of any shape, or may be disposed on either face of the dual opposite combined blower and impeller system housing or even on a side wall in some embodiments as described herein.

The curvilinear impeller outlet aperture 810 provides for a directional airflow spread affording greater airflow volume and a spread of airflow in a wider area from the plane of rotation of blower fan 815 from the impeller side than a blower outlet aperture such as 805. In an example embodiment, the width of the curvilinear impeller outlet aperture 810 between side walls 822 and 824 may determine the angular range of directional airflow spread angle generally provided although some additional airflow current may occur along sides of the spread as described with embodiments herein. It is contemplated that the width of the curvilinear impeller outlet aperture 810 may be sized according to embodiments herein to provide any angular range, such as a 15 degree or greater degree of spread, in directional airflow spread angle with the understanding that reduced side wall sizes for 822 and 824 in the plane of rotation of blower fan 815 may have impacts on pressure generation capabilities at the blower outlet aperture 805 or the curvilinear impeller outlet aperture 810 in various embodiments. The dual opposite combined blower and impeller system of FIG. 8 may operate similarly to several embodiments herein to cause air volume and pressure to be forced to exit both outlets 805 and 810.

Fan blades 817 extend from the fan hub and are angled away from the direction of rotation of blower fan 815 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite combined blower and impeller system housing of FIG. 8 includes a notch 830 and or plural notches 830 and 832 in some embodiments. A notch 830 is formed of the side wall 822 at the curved aperture zone 852 and extends internally into the dual opposite combined blower and impeller system housing. Notch 830 of side wall 822 begins a curvilinear shape at the first aperture 805 in curved aperture zone 852, curves inward to the dual opposite combined blower and impeller system housing, and gradually recedes along the diameter of blower fan 815 in the direction of rotation of fan 815 toward second outlet aperture 810. A gap 868 may be formed via an indentation along the exterior of side wall 822 corresponding to notch 830 shows the dual opposite combined blower and impeller system housing base in an embodiment. It is understood that only a gap 868 formed of the indentation, and no exposed base underneath, may be present in some embodiments. Gap 868 may be used in some embodiments to provide additional internal chassis space when the dual opposite combined blower and impeller system is installed in an information handling system. Notch 830 is formed of side wall 822 such that outlet aperture 805 is narrower than the width Df of the dual opposite combined blower and impeller system housing in the present embodiment. A second notch 832 may be formed similarly to 830 in the side wall 824 at the curvilinear impeller outlet aperture and may extend internally into the dual opposite combined blower and impeller system housing in other embodiments. As with various embodiments herein, the internal extension of any notches such as 830 and 832 or their shape may vary depending on desired pressurization and noise minimization according to various embodiments described herein. It is understood that either or both notches 830 or 832 may be included in various embodiments of the dual opposite combined blower and impeller system described herein and either, both, or neither may be included in an embodiments such as that shown in FIG. 8.

Blower fan 815 is powered by power source 840 which may power and control a blower fan motor. Power source 840 may be operatively connected to a power management system of an information handling system and supply power from a battery power source, an alternating current power source, or other power sources to a blower fan motor (not shown) in various embodiments. Power source 840 may also include one or more control lines to blower fan 815.

As described with various embodiments herein, the dual opposite combined blower and impeller system housing may have a width Df between side walls 822 and 824 in an example embodiment such that the width Df is the width of the dual opposite combined blower and impeller system housing as taken across the diameter Db of blower fan 815 according to an embodiment. Blower fan 815 may have a blade diameter Db that is nearer to the width Df of dual opposite combined blower and impeller system housing between side walls 822 and 824 as described than previous blower systems. In various example embodiments, the dual opposite combined blower and impeller system housing of the embodiments of the present disclosure may enable the blower fan diameter Db to occupy greater than 70% of the width Df of the dual opposite combined blower and impeller system housing between side walls 822 and 824 up to just less than the width of the dual opposite combined blower and impeller system housing across the fan diameter in the plane of rotation. Accordingly, improvement in function of the dual opposite combined blower and impeller system for moving air over previous blower systems may be obtained without sacrificing size or chassis occupancy as described in the present disclosure.

Figure 9:
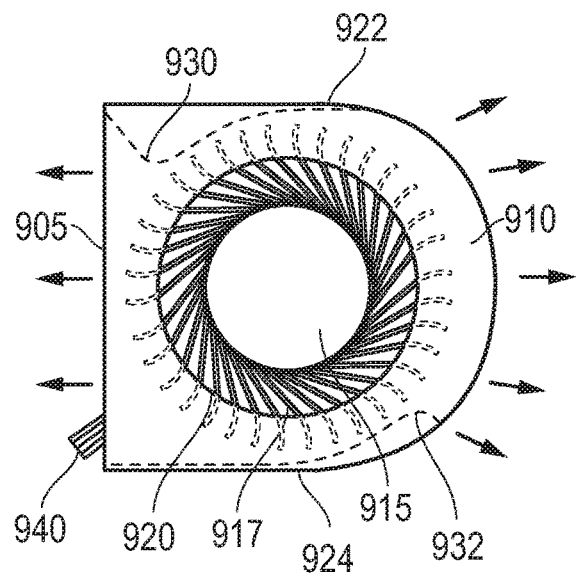
FIG. 9 is a top view of a dual opposite combined blower and impeller system according to another embodiment of the present disclosure.

FIG. 9 shows a top view of a dual opposite combined blower and impeller system according to another embodiment of the present disclosure. FIG. 9 is similar to embodiments described above and is depicted such that elements within the dual opposite combined blower and impeller system housing may be viewed internally. The dual opposite combined blower and impeller system of FIG. 9 depicts a different fan blade 917 shape than other embodiments herein. The dual opposite combined blower and impeller system includes a blower fan 915 with fan blades 917 and a dual opposite combined blower and impeller system housing with side walls 922 and 924, a facing surface including an air inlet at aperture 920, a blower outlet aperture 905, and a curvilinear impeller outlet aperture 910.

The dual opposite combined blower and impeller system similarly has the two outlet apertures may be opposite one another in a plane of rotation of blower fan 915 to embodiments herein such that the flow of air out of the dual opposite combined blower and impeller system housing may happen in generally opposite directions. Further, similar to embodiments herein, the impeller side of the dual opposite combined blower and impeller system may provide for a greater airflow spread than the blower side. In various embodiments, the dual outlet apertures 905 and 910 may have varied shapes and sizes including various widths or thicknesses. Similarly, the air inlet 920 to the dual opposite combined blower and impeller system housing may be plural air inlet apertures, may be of any shape, or may be disposed on either face of the dual opposite combined blower and impeller system housing or even on a side wall in some embodiments as described herein.

Fan blades 917 extend from the fan hub and extend with a curvilinear shape from the fan hub to the fan diameter edge of blower fan 915 as in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite combined blower and impeller system housing of FIG. 9 may include one or more notches, such as 930 or 932, formed in side walls 922 or 924. Notch 930 may have a curvilinear shape or any shape that extends internally into the dual opposite combined blower and impeller system housing as described in various other embodiments herein. It is understood that any shape including angled, pointed, rounded, wavy, or other shaped notches and any internal extension amount of notch 930 or plural notches may be used according to embodiments herein. The shape and internal extension of the notches may vary depending on desired pressurization and noise minimization according to various embodiments. In some embodiments, a second notch 932 may be formed in side wall 924 similar to embodiments described herein. It is understood that either or both notches 930 or 932 may be included in various embodiments of the dual opposite combined blower and impeller system described herein and either, both, or neither may be included in an embodiments such as that shown in FIG. 9.

Blower fan 915 is powered by power source 940 which may power and control a blower fan motor. Power source 940 may be operatively connected to a power management system of an information handling system and supply power from a battery power source, an alternating current power source, or other power sources to a blower fan motor (not shown) in various embodiments. Power source 940 may also include one or more control lines to blower fan 915.

As described with various embodiments herein, the dual opposite combined blower and impeller system housing may have a width Df between side walls 922 and 924 in an example embodiment such that the width Df is the width of the dual opposite combined blower and impeller system housing as taken across the diameter Db of blower fan 915 and curvilinear blades 917 according to an embodiment. In various example embodiments, the dual opposite combined blower and impeller system housing of the embodiments of the present disclosure may enable the blower fan diameter Db to occupy greater than 70% of the width Df of the dual opposite combined blower and impeller system housing between side walls 922 and 924 up to just less than the width of the dual opposite combined blower and impeller system housing across the fan diameter in the plane of rotation. Accordingly, improvement in function of the dual opposite combined blower and impeller system for moving air over previous blower systems may be obtained without sacrificing size or chassis occupancy as described in the present disclosure.

FIG. 10A shows a top view of an information handling system chassis 1000 having a dual opposite combined blower and impeller system according to an embodiment of the present disclosure. FIG. 10A is depicted such that elements within the information handling system chassis including the dual opposite combined blower and impeller system housing 1023 may be viewed internal to the chassis 1000.

The dual opposite combined blower and impeller system housing 1023 is shown disposed in information handling system chassis 1000 having a blower fan 1015 with blades 1017. The dual opposite combined blower and impeller system housing 1023 includes a first side wall and a second side wall. In some embodiments, the dual opposite combined blower and impeller system housing 1023 may include a notch (not shown) in one or either side wall as described with several embodiments herein. The dual opposite combined blower and impeller system housing 1023 includes a first blower outlet aperture in the plane of rotation of blower fan 315 and oppositely disposed from a second curvilinear impeller outlet aperture. The dual opposite combined blower and impeller system housing 1023 also includes an inlet aperture according to various embodiments described herein such as in FIGS. 3A-9. The inlet aperture or apertures may be aligned with an intake vent of chassis 1000 in an embodiment. In an example embodiment, the intake vent is in the bottom of an information handling system chassis. In other embodiments, the intake vent may be on top, or on any side of the information handling system chassis 1000.

Airflow from the dual opposite combined blower and impeller system housing 1023 is shown in FIG. 10A with respect to the information handling system chassis 1000. For example, the dual opposite combined blower and impeller system housing 1023 shows an airflow 1072 from a first blower outlet aperture on the blower side of the first dual opposite combined blower and impeller system housing 1023 in an embodiment. Additionally, the first dual opposite combined blower and impeller system housing 1023 shows an impeller airflow 1075 from the curvilinear impeller outlet aperture of the impeller side of the first dual opposite combined blower and impeller system housing 1023.

Exhaust vents may be embedded in the side of the information handling system chassis 1000 in an embodiments. In one example embodiment as shown, fin stack 1050 may be disposed adjacent or proximate to exhaust vents of the information handling system chassis 1000.

In one embodiment, fin stack 1050 is disposed between the blower outlet aperture of the dual opposite combined blower and impeller system housing 1023 and an exhaust vent of the chassis 1000. Airflow 1072 from the first dual opposite combined blower and impeller system housing 1023 may exhaust air across fin stack 1050 to the exhaust vent of information handling system chassis 1000.

In an embodiment, fin stack 1050 may be thermally coupled to a heat producing component via heat pipe 1041 or 1042. Additionally, one or more cold plates such as 1040 may be operatively coupled between heat producing components and the fin stack 1050. For example, heat pipes 1041 or 1042 and cold plates 1040 may be thermally coupled on or adjacent to one or more heat producing components, such as a processor (not shown), in an embodiment according to thermal management system techniques understood by those of skill in the art. In one example embodiment, cold plate 1040 may be thermally coupled via thermally conductive attachment, directly or via thermally conductive layers of material, to a central processor or a graphics processor. Thermal coupling may be achieved by other methods as well. For example, thermal coupling between a heat producing component such as a CPU or GPU and fin stacks may be achieved via liquid cooling, vapor chambers, or other systems for transferring heat to a heat exchanger.

In a further embodiment, impeller airflow 1075 from the dual opposite combined blower and impeller system housing 1023 may be forced via blower fan 1015 in a spread airflow to disperse air into the internal cavity of information handling system chassis 1000. The impeller airflow 1075 may also operate to provide spread airflow angle into an area of the chassis containing other heat producing components 1062 in some embodiments. For example, impeller airflow 1075 may provide spread airflow to a power system component in the information handling system chassis 1000 such as battery as depicted in the presently described embodiment.

In further embodiments, impeller airflow 1075 may provide air volume to a pressurized zone 1060 in an internal cavity of information handling system chassis 1000. Airflow 1075 may be forced across fin stack 1050 or a different fin stack (not shown) such as with airflow 1074 shown exiting the chassis 1000 across fin stack 1050. Further, heat producing components and other components may be located within the pressurized zone 1060 of the information handling system chassis 1000. In an example embodiment, one or more fin stacks such as 1050 may be thermally coupled to cold plate 1040 via heat pipe 1041 or 1042 in an embodiment. In embodiments such as described, the pressurized zone 1060 in the internal cavity of information handling system chassis 1000 provides for flexibility of placement of heat stacks within the information handling system chassis 1000. Moreover, the pressurized zone 1060 provides for additional air movement within the internal cavity of information handling system chassis 1000 to further cool cold plate 1040 as well as other components such as 1062. Moreover, the dual opposite combined blower and impeller system housing 1023 may occupy less internal space of the information handling system chassis 1000 and provide equal or better airflow performance as described with several embodiments herein.

Figure 10B:
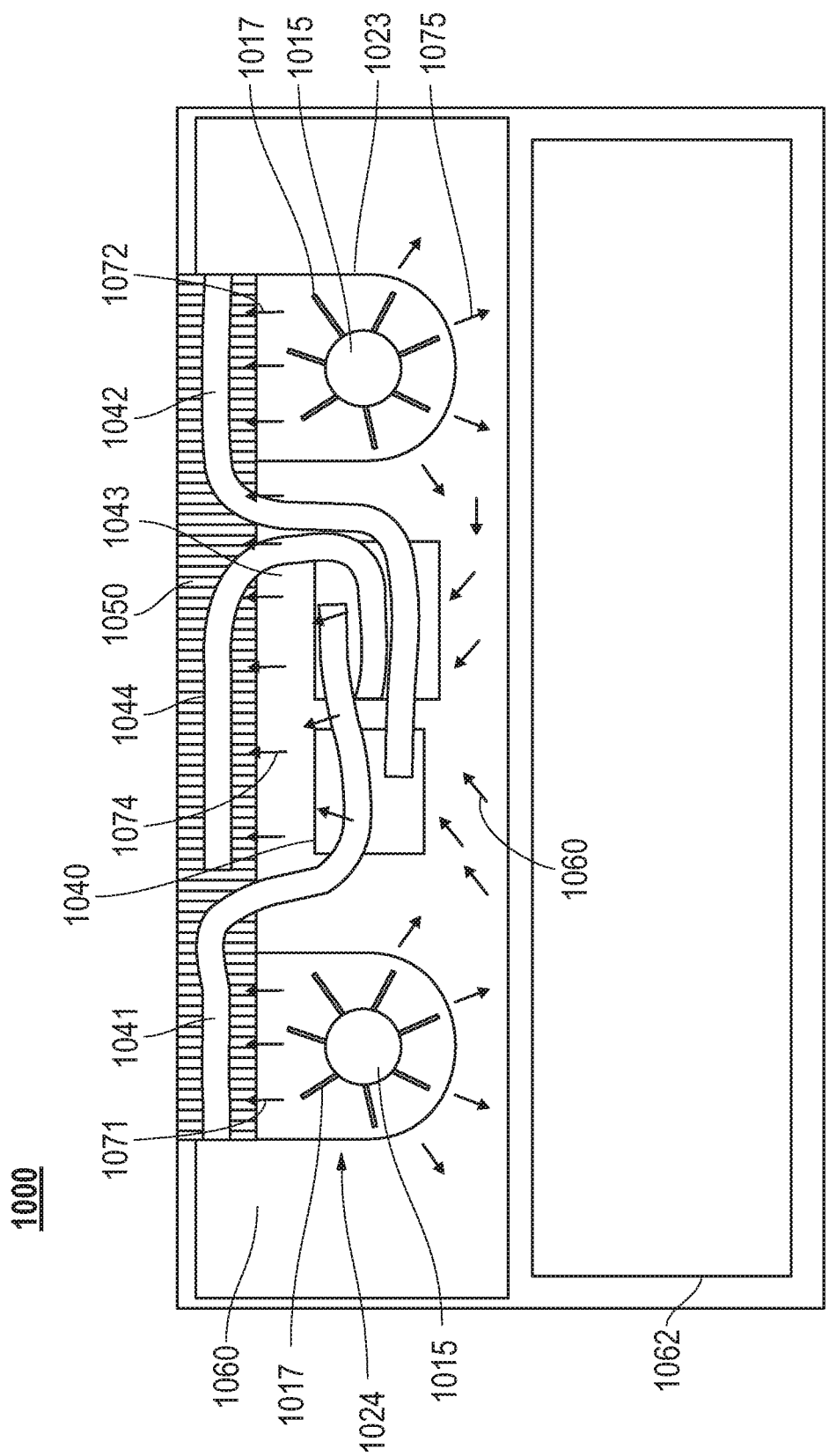
FIG. 10B is a top view of an information handling system with a plurality of dual opposite combined blower and impeller systems according to an embodiment of the present disclosure.

FIG. 10B shows a top view of an information handling system chassis 1000 having a plurality of dual opposite combined blower and impeller systems 1023 and 1024 according to an embodiment of the present disclosure. FIG.

10B is depicted such that elements within the information handling system chassis including a first dual opposite combined blower and impeller system housing 1023 and a second dual opposite blower system housing 1024 may be viewed internal to the chassis 1000.

First dual opposite combined blower and impeller system housing 1023 and the second dual opposite combined blower and impeller system housing 1024 are shown disposed in information handling system chassis 1000 and each have a blower fan 1015 with blades 1017. The first dual opposite combined blower and impeller system housing 1023 and second dual opposite combined blower and impeller system housing 1024 each include a first side wall and a second side wall. In some embodiments, first dual opposite combined blower and impeller system housing 1023 or second dual opposite combined blower and impeller system housing 1024 may include a notch (not shown) in one or either side wall as described with several embodiments herein. Each of the first dual opposite combined blower and impeller system housing 1023 and second dual opposite combined blower and impeller system housing 1024 includes a first blower outlet aperture in the plane of rotation of blower fan 315 and oppositely disposed from a second curvilinear impeller outlet aperture. Each of the first dual opposite combined blower and impeller system housing 1023 and second dual opposite combined blower and impeller system housing 1024 also include an inlet aperture according to various embodiments described herein such as in FIGS. 3A-9. The inlet apertures may be aligned with an intake vent of chassis 1000 in an embodiment. In an example embodiment, the intake vent is in the bottom of an information handling system chassis. In other embodiments, the intake vent may be on top, or on any side of the information handling system chassis 1000.

Airflow from the first dual opposite combined blower and impeller system housing 1023 and the second dual opposite combined blower and impeller system housing 1024 are shown in FIG. 10B with respect to the information handling system chassis 1000. For example, the first dual opposite combined blower and impeller system housing 1023 shows an airflow 1072 from a first blower outlet aperture on the blower side of the first dual opposite combined blower and impeller system housing 1023 in an embodiment. Additionally, the first dual opposite combined blower and impeller system housing 1023 shows an impeller airflow 1075 from the curvilinear impeller outlet aperture of the impeller side of the first dual opposite combined blower and impeller system housing 1023. Similarly, the second dual opposite combined blower and impeller system housing 1024 shows an airflow 1071 from a first blower outlet aperture on the blower side of the from a first blower outlet aperture on the blower side of the first dual opposite combined blower and impeller system housing 1023 in an embodiment. Likewise, the second dual opposite combined blower and impeller system housing 1024 shows an impeller airflow 1073 from the curvilinear impeller outlet aperture of the impeller side of the second dual opposite combined blower and impeller system housing 1024.

Exhaust vents may be embedded in the side of the information handling system chassis 1000 in an embodiments. In one example embodiment as shown, fin stack 1050 may be disposed adjacent or proximate to exhaust vents of the information handling system chassis 1000.

In one embodiment, fin stack 1050 is disposed between the blower outlet aperture of both the first dual opposite combined blower and impeller system housing 1023 as well as the blower outlet aperture of the second dual opposite combined blower and impeller system housing 1024 and an exhaust vent of the chassis 1000. Airflow 1072 and airflow 1071 from both the first dual opposite combined blower and impeller system housing 1023 and second dual opposite combined blower and impeller system housing 1024 may exhaust air across fin stack 1050 to the exhaust vent of information handling system chassis 1000.

In an embodiment, fin stack 1050 may be thermally coupled to a heat producing component via heat pipe 1041, 1042 and 1044. Additionally, one or more cold plates 1040 and 1043 may be operatively coupled between heat producing components and the fin stack 1050. For example, heat pipes 1041, 1042, and 1044 and cold plates 1040 and 1042 may be thermally coupled on or adjacent to one or more heat producing components, such as a processor (not shown), in an embodiment according to thermal management system techniques understood by those of skill in the art. In one example embodiment, cold plates 1040 may be thermally coupled via thermally conductive attachment, directly or via thermally conductive layers of material, to a central processor. In another example embodiment, cold plate 1043 may be thermally coupled to a graphics processor. Thermal coupling may be achieved by other methods as well. For example, thermal coupling between a heat producing component such as a CPU or GPU and fin stacks may be achieved via liquid cooling, vapor chambers, or other systems for transferring heat to a heat exchanger.

In a further embodiment, impeller airflow 1075 from the first dual opposite combined blower and impeller system housing 1023 and impeller airflow 1073 from the second dual opposite combined blower and impeller system housing 1024 may be forced via blower fan 1015 in a spread airflow to disperse air into the internal cavity of information handling system chassis 1000. The impeller airflows 1075 and 1073 may also operate to provide spread airflow angle into an area of the chassis containing other heat producing components 1062 in other embodiments. For example, impeller airflows 1075 and 1073 may provide spread airflow to a power system component in the information handling system chassis 1000 such as battery as depicted in the presently described embodiment.

In further embodiments, impeller airflows 1075 and 1073 may provide air volume to a pressurized zone 1060 in an internal cavity of information handling system chassis 1000. Airflows 1075 and 1073 may be forced across fin stack 1050, heat producing components and to the same or another exhaust vent of the information handling system chassis 1000. For example, airflow from pressurized zone 1060 in an example embodiment may be forced across fin stack 1050 as airflow 1074 and exit an exhaust vent in information handling system chassis 1000. As with other example embodiments, fin stack 1050 may be thermally coupled to cold plate 1043 via heat pipe 1044 in an embodiment. In such an embodiment, the pressurized zone 1060 in the internal cavity of information handling system chassis 1000 provides for flexibility of placement of heat stacks within the information handling system chassis 1000. Moreover, the pressurized zone 1060 provides for additional air movement within the internal cavity of information handling system chassis 1000 to further cool cold plate 1040 or cold plate 1043 as well as other components.

In one aspect, information handling system chassis 1000 of FIG. 10A and FIG. 10B include a top surface, bottom surface, and sides as would be understood by those of skill in the art. Information handling system chassis 1000 may be a case for housing one or more processors, memory, wireless network adapter, connectors, power systems and other components such as for a mobile information handling system including a laptop, tablet, dual screen tablet, mobile smart phone, or similar devices. Information handling system chassis 1000 may also be a case for housing processors, memory, power systems, connectors and the like for other information handling systems such as desktops, server systems, routers, switches, intelligent communication systems, wireless transmitters, wireless adapters, and the like. Information handling system chassis 1000 may include a variety of sealing measures to better seal an internal cavity to assist with pressurization of the pressurized zone 1060 of the current embodiments. For example, gaskets, adhesives, and high tolerance connectors at seams may be used among the connecting panels forming the top, bottom, sides, or edges of the information handling system chassis in some embodiments. Further, sealed data ports and power ports, sealed keyboard components and other I/O input components, as well as sealed hinge elements may be used in other embodiments. Gaskets or other known sealing measures may also be used with inlet vents as well as around exhaust vents in yet other embodiments. These sealing measures are used to direct pressurized air in pressurized zone 1060 of the internal cavity to exhaust vents to provide for direction to co-located fin stacks such as 1050 in some embodiments. In one example embodiment where not all components shown in FIG. 10A or 10B are necessarily included a plurality of fin stacks may not be used and cooling air in pressurized zone 1060 may be exhausted one or more exhaust vents as shown. Such movement of cooling air within the chassis may be sufficient without the additional fin stacks at those exhaust vents. Any combination of exhaust vents, fin stacks, and any number of dual opposite combined blower and impeller systems are contemplated as used within an information handling system chassis. Such variation is contemplated because these dual opposite combined blower and impeller systems may be utilized with a wide variety of information handling systems with a vast number of combinations of components and chassis layouts.

It is understood that dual opposite combined blower and impeller system housings 1023 or 1024, processor components, fin stacks such as 1050, and various other components may be arranged in a variety of locations in the information handling system chassis 1000 according to variations on the current embodiments. Moreover, one or more of dual opposite combined blower and impeller system housings 1023 or 1024, fin stacks such as 1050, cold plates 1040 or 1043, or other components may not occur in all embodiments. The internally pressurized cavity of information handling system chassis provides for placement of exhaust vents and fin stacks near the exhaust vents at a variety of locations providing flexibility for layout of components in the information handling system chassis 1000 and saving costs and improving space usage efficiency. For example, some information handling systems may only utilize a combined central processor and graphics processor in some example embodiments. Further, dual opposite combined blower and impeller system housings 1023 or 1024 may be of any embodiment or variation of the embodiments of FIGS. 3A-9 as shown or described herein. In other example embodiment, not all of the elements shown in the information handling system chassis 1000 need appear in all embodiments contemplated by the embodiments herein. For example, some embodiments of information handling system may include only one dual opposite combined blower and impeller system and may have only a CPU and require fewer or only one fin stack. One of the opposite outlets in such an embodiment that points inside the information handling system chassis for example could exhaust through a simple mechanical slot and may not require a co-located fin stack. Such internal air flow still accomplishes convection air cooling of all components within the information handling system chassis. Various combinations of numbers of dual opposite combined blower and impeller systems, fin stacks, cold plates and the like are contemplated as embodiment variations on that described with respect to either FIG. 10A or FIG. 10B.

It is understood that dual opposite combined blower and impeller system housings 1023 or 1024, processor components, fin stacks such as 1050, cold plates 1040 or 1044, heat pipes such as 1041, 1042 or 1044, and various other components may be arranged in a variety of locations in the information handling system chassis 1000 according to variations on the current embodiments. Moreover, one or more of dual opposite combined blower and impeller system housings 1023 or 1024, fin stacks such as 1050, cold plates 1040 or 1043, heat pipes 1041, 1042, or 1044 or other components may not occur in all embodiments. For example, some information handling systems may only utilize a combined central processor and graphics processor in some example embodiments. Further, dual opposite combined blower and impeller system housings 1023 or 1024 may be of any embodiment or variation of the embodiments of FIGS. 3A-9 as shown or described herein.

Figure 11:
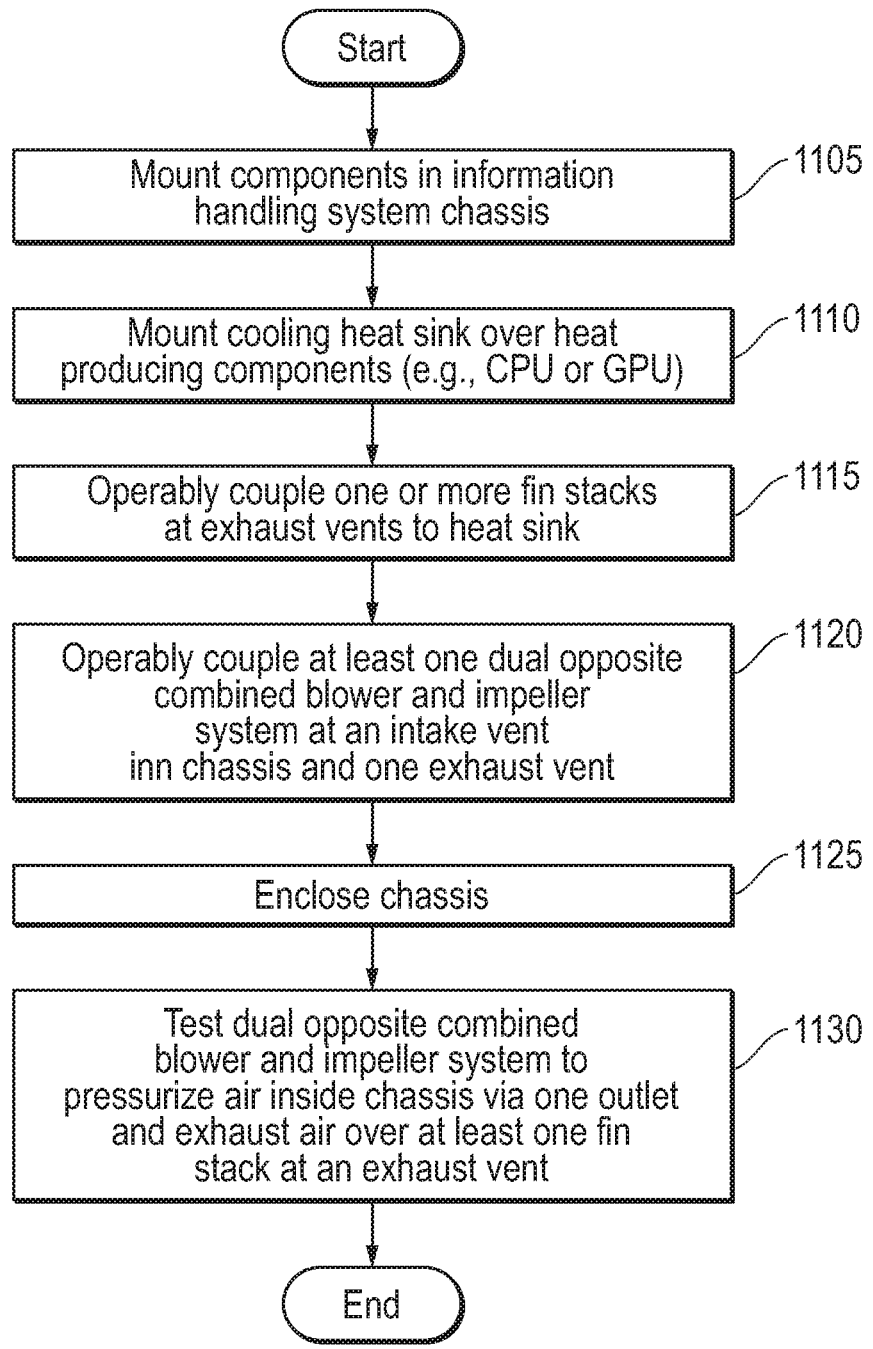
FIG. 11 is a flow diagram illustrating method of assembly of an information handling system with dual opposite combined blower and impeller system according to an embodiment of the present disclosure.

FIG. 11 shows a method of assembling an information handling system having a dual opposite combined blower and impeller system and thermal management system according to a plurality of embodiments disclosed in the present disclosure. At 1105, a selection of components for a model specification are mounted in an information handling system chassis according to a layout for such a model specification. Processors, embedded controllers, microcontrollers or other processing logic may be mounted on a motherboard for example. For example, at least one CPU, which may include an onboard GPU, may be mounted on a motherboard in one example embodiment. In another example embodiment, a GPU may be mounted on a graphics card that is part of or in addition to a motherboard. Memory, network interface adapters either wired or wireless, and power systems including power management unit, battery systems, and power source connections, digital to analog converters and the like may all also be mounted within an information handling system chassis. In yet other embodiments, switching systems, power transformers, and other components may be included in an information handling system chassis. For example, many of the components of an information handling system as described in FIG. 1 or subsystems supporting those systems of FIG. 1 or similar information handling systems understood in the art may be mounted in an information handling system chassis.

Mounting of components in the information handling system chassis may occur by conventional methods for each type of component. For example, mounting of microchips for processing logic, memory, controls, power control systems, network interfacing, graphics, sound, or other processing capabilities may be mounted on chip mounts with solder connection, compression connection, plug and socket connection, inductive connection, or the like. Boards such as motherboards, graphics boards, power management boards, memory boards, sound boards, interface boards, or the like may be combination boards or individual boards in accordance with the subsystems of information handling systems understood by those in the art or as described, for example, with the various embodiments of FIG. 1 or others described herein.

In one aspect, motherboard components may include a CPU, a CPU mount, a plurality of memory chips, power management system chips, wireless adapter chips, network adapter or I/O connector driver chips, sound chips, as well as CPU location, memory locations, the CPU chip pin breakout memory pin breakout in the PCB. Further, the system may include routing between the CPU, GPU, power management system, wireless and wired interface adapters, and memory. Additional motherboard aspects include power planes under the CPU and memory to support their operation as well as bus connectivity interface links to other parts of the information handling system including those of PCIe, DisplayPort, or other display data bus connectivity. In another aspect, graphics board components may include a GPU, a GPU mount, a plurality of graphics memory chips and the GPU location, memory locations, the GPU chip pin breakout memory pin breakout in the PCB, and routing between the GPU and graphics memory.

Additional graphics board aspects include power planes under the GPU and memory to support their operation as well as bus connectivity interface links to other parts of the information handling system including those of PCIe, DisplayPort, or other display data bus connectivity. One or more of the above chips may be combined, as is understood in the art, into single microchips. For example, some information handling systems may include combination CPU and GPU processing. Boards may be mounted with connectors such as screws, clips, clamps, slots, compression connections, snap fit connections or other known and understood by those of skill in the art. Further, the location of the external data ports for the data connectivity including display data, such as DisplayPort, HDMI, USB, or other display data communication port components as well as I/O devices integrated in some embodiments such as keyboards, keypads or the like are set out for the information handing system chassis. Some of these components are added at various stages of the assembly as appropriate and may be different among various models or types of information handling systems. Selection of the chassis layout with respect to the various information handling system subsystem components is more flexible with respect to thermal management locations due to the improvements available with the dual opposite combined blower and impeller system of the present disclosure.

Proceeding to 1110, the assembly includes installation of components of a thermal management system including a dual opposite combined blower and impeller system of the present disclosure. The order of assembly of components of the information handling system including the dual opposite combined blower and impeller system or systems of the present disclosure is not necessarily ordered as set forth in the example of FIG. 11, however. In an example embodiment, the base of the chassis of the information handling system chassis is assembled and components including microchips, memory structures, boards and the like are mounted. Connections between subsystems and ports may occur followed by thermal and power connections. Installation of the dual opposite combined blower and impeller system of the present disclosure may occur at any time in any order under various embodiments. As part of that thermal management system, a head sink may be mounted over one or more heat producing components in the chassis of the information handling system. The cold plate, for example such as that shown as 1040 in FIG. 10A or 1040 and 1043 in FIG. 10B, may be mounted adjacent to a heat producing component and may be in physical contact with that component or may be operatively and thermally coupled with that heat producing component through thermally conductive layers such as thermally conductive pads, thermally conductive adhesive, thermally conductive connectors, or the like. Any thermal contact system and method may be used to thermally couple the cold plate to the heat producing component. Heat producing components frequently include processing logic such as CPUs and GPUs as well a power system components in various embodiments. Additional components may include active switch and router logic, microcontroller, transmission systems, power management components, power line connectors and traces, lighting, and similar components in some embodiments.

At 1115, the cold plate, for example such as that shown as 1040 in FIG. 10A or 1040 and 1043 in FIG. 10B, may be operatively and thermally coupled to one or more fin stacks in the information handling system chassis. Fin stacks include a plurality of fins for dissipation of heat as understood in the art. The fin stack in some embodiments may be part of the same unit as a cold plate. In other embodiments, a fin stack may be operatively and thermally coupled to a cold plate. In yet other embodiments, one or more fin stacks may be operatively and thermally coupled to a cold plate via a heat pipe. For example, cold plate 1040 is thermally and operatively coupled to one or more fin stacks 1050 in FIG. 10A or 10B via heat pipes 1041 and 1042. Similarly, cold plate 1043 of FIG. 10B is thermally and operatively coupled to one or more fin stacks 1050 via heat pipes 1041 and 1044. Cold plate, heat pipe, and fin stack may be a single unit made of thermally conductive material such as thermally conductive metals or may be one or more individual components thermally and operatively coupled. Placement of the fin stacks is flexible with the dual opposite combined blower and impeller system of the present disclosure. The location of the fin stacks and dual opposite combined blower and impeller system are flexible as is the location of exhaust vents from the information handling system chassis. In optional embodiments, the dual opposite combined blower and impeller may provide internal pressurization of the chassis. The fin stacks may be more advantageously placed near exhaust vent locations of the information handling system chassis. Thus, air may be pushed across those fin stacks by an outlet aperture on the blower side of the dual opposite combined blower and impeller system of the present disclosure or air movement within the cavity or by pressurized air in the cavity of the information handling system chassis due to an outlet of impeller side of the dual opposite combined blower and impeller system. In an embodiment, the fin stack or fin stacks are located at or near exhaust vents of the information handling system.

At 1120, the dual opposite combined blower and impeller system of the present disclosure may be mounted in an information handling system. An inlet aperture of the dual opposite combined blower and impeller may be aligned with an inlet vent of the information handling system chassis surface in one embodiment. At least the blower side outlet aperture of the dual opposite combined blower and impeller system may be located near an exhaust vent of the information handling system chassis in one embodiment. The other, curvilinear impeller aperture of the dual opposite combined blower and impeller system may be directed inward to the information handling system chassis to circulate air therein. In some embodiments, the dual opposite combined blower and impeller may draw air into the information handling system chassis cavity and pressurize the cavity therein.

Proceeding to 1125, after final components such as external data and power connectors, inlet vents and exhaust vents, integrated I/O devices such as keyboards, touchpads, touch-screens, display screens, indicator lights, hinge components, or any other components are mounted on or in the information handling system chassis, the chassis may be enclosed. In an optional embodiment, prior to enclosure, sealing measures may be taken to facilitate the thermal management system to pressurize the internal cavity of the information handling system. This may include sealing any seams between top, bottom, side, or edge panels with gaskets, adhesive, sealant materials, or via other methods in some embodiments. Also, the method may provide for sealing of I/O data ports and I/O devices integrated in the information handling system chassis with gaskets or panels to limit airflow from those ports or devices in some embodiments. It is important to note that perfect sealing measures are not required for these optional embodiments to facilitate internal pressurization of the information handling system chassis. In fact, in some embodiments some leakage might be advantageous as it draws air over one or more remote components that may not receive as much airflow in an internally pressurized information handling system chassis. For example, a Thunderbolt controller or other specialized controller may draw a high average amount of wattage. In the case of such a component, such as a Thunderbolt controller, it may be placed by its respective Universal Serial Bus (USB) Type-C ports. The small leakage through the USB Type-C ports may be undetectable by the user, but still alleviate heat build-up around the Thunderbolt controller chip.

Then the panels and edges of the information handling system may be enclosed together to form an internal cavity of the information handling system chassis to support and contain most of the aforementioned components or support those components with outside interfacing. This may include one or more of each of a top panel, bottom panel, side panels, edges, or some combination. It is understood that any contour, design, shape, or structure may be used in the panels or edges and the directions top, bottom, side, or edge are relative terms to a generally rectangular box-shaped chassis, however any shape chassis is contemplated. In one example embodiment, the bottom panel face of the information handling system chassis for a laptop may include an inlet intake vent aligned with the inlet of the dual opposite combined blower and impeller system. In other embodiments, the inlet may be operatively coupled to pull airflow into the inlet of the dual opposite combined blower and impeller system from any edge or surface of the information handling system chassis. In another example embodiment, a side panel or an edge of a laptop may include one or more exhaust vents. For a mobile information handling system such as a laptop, tablet, dual screen tablet or for other information handling systems such as servers, desktops, routers, access points, or others any orientation of inlet intake vents and exhaust vents is contemplated for various embodiments. To enclose the information handling system chassis, any number of chassis enclosure methods may be used including snap fit enclosure of top, bottom, side, or edge panels or via use of fasteners such as screws, clips, slots, clamps, or other fastening or clamping systems understood in the art.

Proceeding to 1130, in an optional embodiment, the assembly method may include testing the operation of the dual opposite combined blower and impeller system with the assembled information handling system. This may include connecting the information handling system to power and controlling or operating the information handling system until the thermal management system turns the dual opposite combined blower and impeller system on. Upon the activation of the dual opposite combined blower and impeller system, air will enter the inlet intake vent. One outlet aperture will blow air out a nearby exhaust vent an over an intermediate fin stack. Another outlet aperture of the dual opposite combined blower and impeller system will push air into the internal cavity of the information handling system chassis causing air to outlet at other exhaust vents in the information handling system chassis. At this point the process may end. It is appreciated that the process described with respect to FIG. 11 may be utilized for any model or type of information handling system and the model specification may determine the information handling system chassis layout. With the dual opposite combined blower and impeller system, the flexibility of adapting a thermal management system to location of inlet and exhaust vents in the information handling system chassis is flexible allowing designs to minimize space usage, allow placement of components in a variety of locations as desired for design considerations, to generate maximum cooling effect by the thermal management system, or some combination. Such a feature is beneficial to costs and time of development of graphics boards for use with model specification assemblies for a wide variety of information handling system models and types and further improving overall design efficiencies.

The depictions in FIGS. 3-10 are meant for illustration and do not necessarily represent accurate sizes or relationships between aspects of the dual opposite combined blower and impeller system housing, the blower fan and blades, fan hub, apertures and other structures except as specified herein. Size and shape of fan blades, thickness of blower fan, size and shape of outlet apertures and inlet apertures, and size and shape of side wall notches may all be varied in multiple embodiments and in any combination. In an embodiment, the size and shape of one or both the outlet apertures may be smaller or larger than the width or thickness of the dual opposite combined blower and impeller system housing. In another embodiment, the side wall notch for compressing air to the blower side may be angled, pointed, slanted, curvilinear, rounded, or of a variety of shapes along the side walls of the dual opposite combined blower and impeller system. In another embodiment, a side wall notch along a side wall may compress air moved to the impeller side and may be angled, pointed, slanted, curvilinear, rounded, or of a variety of shapes along the side wall or walls of the dual opposite combined blower and impeller system. In yet another example embodiment, one or more inlet apertures may be of any size or shape.

Further in FIGS. 11A and 11B, the central processor, graphics processor, heat pipe, fin stacks, thermal system, exhaust vents, battery or other components of the information handling system depicted therein are also meant for illustration and do not necessarily represent accurate sizes or relationships between aspects. It may also be appreciated that variations on the configurations are also contemplated including location and alignments of central processor, graphics processor which may be separate or combined with the central processor, dual opposite combined blower and impeller system, heat pipe, fin stacks, thermal system, exhaust vents, inlet vents, and other components of the information handling system and are meant for illustration and do not necessarily represent any limitation on location or relationships between those components within an information handling system chassis. For example, location central processor, any separate graphics processor or other heat producing component, the dual opposite combined blower and impeller system, heat pipe, fin stacks, thermal system, exhaust vents, inlet vents, and other components is meant to be flexible in location due to location of the exhaust vents, any desired pressurization of the internal space of the information handling system by the dual opposite combined blower and impeller system, or location of heat producing elements within the chassis relative to the impeller side of the dual opposite combined blower and impeller system. Similarly, the location of a plurality of dual opposite combined blower and impeller system may vary as well. Other variations of the embodiments for location, size and relationships of components herein are contemplated.

It is understood that the structures and concepts described in the embodiments above for FIGS. 1-11 may be constructed using a variety of the components. For example, the dual opposite combined blower and impeller system housing may be any of or a combination of a metal, plastic, acrylic, or other strong material. The dual opposite combined blower and impeller system housing may include portions, such as the side walls and top and bottom surfaces that are a single component or assembled of one or more components. Notches in the side walls may be formed of the side walls or may be component additions added to the side walls. As described, a variety of sizes of the side wall notches may be selected to modify pressure generation or affect noise developed during operation of the dual opposite combined blower and impeller system. The dual opposite combined blower and impeller system housing may have a blower fan installed with motor and power source connection and mounted on a first or second surface. The first or second surface of the dual opposite combined blower and impeller system housing may be mounted in an information handling system in any orientation and is not limited to a top surface or bottom surface as described with respect to the drawing embodiments herein for purposes of illustration. The blower fan may include a variety of blower fan types including blade shapes and hub diameters as described herein or understood in the art. Further, the blower fan, blower fan motor, blades, and power connection may be comprised of materials used by those of skill in the art to build such blower fans. It is also understood that for the methods in FIG. 11 some steps may be omitted, additional steps may be performed, or steps may not be performed in the order depicted according to variations of the embodiments as understood by those of skill. In particular, for embodiments of the figures disclosed herein, some varied embodiments may utilize certain components or techniques which may also be combined with portions of any other embodiments in the present disclosure to form a variety of additional embodiments from aspects of those embodiments described herein.

In some embodiments, dedicated hardware implementations such as application specific integrated circuits, programmable logic arrays and other hardware devices can be constructed to comprise one or more of the internal components described herein or portions of one or more of the internal components described herein including processors requiring thermal management. Applications that may include the apparatus and systems of various embodiments can broadly include a variety of electronic and computer systems. One or more embodiments described herein may implement functions using one or more specific interconnected hardware structures to provide a flexible thermal management system with improved air movement capability among internal components of an information handling system while maintaining a unibody appearance of the chassis.

In accordance with various embodiments of the present disclosure, the dual opposite combined blower and impeller system housing and fan blower may be operatively coupled, mounted, or otherwise attached within an information handling system chassis via attachment methods or structures described or as understood by those of skill in the art to mount components in an information handling system. Example specific methods and structures include screws, adhesives, clips, slots, clamps, pads, wires, foam, springs, welds, and others as described herein and which may be implemented by numerous embodiments described.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The device or module can include software, including firmware embedded at a device, such as an Intel® Core or ARM® RISC brand processors, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or structures that are operatively coupled with one another need not be in continuous coupling or communication with each other, unless expressly specified otherwise. In addition, devices, modules, resources, or structures that are in operatively coupled with one another can be coupled directly or indirectly through one or more intermediaries. Further, devices, structures or other aspects of the dual opposite combined blower and impeller system for information handling systems described or shown as coupled or connected to one another may be connected or coupled in all cases through one or more additional intermediary structures or devices or some structures and devices may not be needed or intermediary as shown or described. Several example embodiments are described where such a coupling or connection of structures may exist.

Although only a few exemplary embodiments have been described in detail herein, those skilled in the art will appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:
1. A dual opposite combined blower and impeller system comprising:
    a power source and a blower fan motor for rotating a blower fan having a plurality of blades and a fan diameter for rotation of the blower fan in a rotational plane;

a dual opposite combined blower and impeller system housing including first surface having a fan inlet aperture, a second surface oppositely disposed of the first surface on which the blower fan is operatively coupled inside the dual opposite combined blower and impeller system housing, a first side wall having a first notch extending inward along the fan diameter, and a second side wall oppositely disposed to the first side wall to form the dual opposite combined blower and impeller system housing;

the dual opposite combined blower and impeller system housing including a first outlet aperture between the first side wall and the second side wall in the rotational plane of the blower fan; and the dual opposite combined blower and impeller system housing including a second, curvilinear impeller aperture between the first side wall and the second side wall in the rotational plane of the blower fan disposed opposite the first outlet aperture, wherein the second, curvilinear impeller aperture curves around a diameter of the blower fan on the impeller side of the dual opposite combined blower and impeller system.

2. The dual opposite combined blower and impeller system of claim 1 wherein the second, curvilinear impeller aperture provides a spread airflow angle of at least 30 degrees from the blower fan.

3. The dual opposite combined blower and impeller system of claim 1 wherein the fan diameter including the plurality of blades is greater than 85% of a width of the dual opposite combined blower and impeller system housing between the first side wall and the second side wall.

4. The dual opposite combined blower and impeller system of claim 1 wherein the plurality of blades extend from a rotating fan hub angled away from a direction of rotation to the fan diameter of the blower fan.

5. The dual opposite combined blower and impeller system of claim 1 wherein the plurality of blades may extend linearly from a rotating fan hub to the fan diameter of the blower fan.

6. The dual opposite combined blower and impeller system of claim 1 wherein the first notch is a curvilinear extension inward of the first side wall to pressurize air upon rotation of the blower fan in the dual opposite combined blower and impeller system housing along the first side wall.

7. The dual opposite combined blower and impeller system of claim 1 wherein the dual opposite combined blower and impeller system housing includes a plurality of fan inlet apertures.

8. An information handling system comprising:
a chassis with a central processor, a memory, and a power source;
a dual opposite combined blower and impeller system for thermal management comprising:
  a powered blower fan for rotating a plurality of blades within a dual opposite combined blower and impeller system housing;
  the dual opposite combined blower and impeller system housing including first surface and a second surface oppositely disposed on either side of a rotational plane of the powered blower fan, wherein the first surface or second surface has a fan inlet aperture;
  the dual opposite combined blower and impeller system housing having a first side wall and second side wall oppositely disposed to the first side wall and disposed between the first surface and the second surface;
  a first notch of the first side wall extending internally along the first side of a diameter of the powered blower fan in the rotational plane;
  a first outlet aperture in the rotational plane of the blower fan moving air in a first direction to a cooling fin stack for directed cooling of the fin stack, pressurize an internal cavity of the chassis; and
  a second, curvilinear impeller aperture in the rotational plane of the blower fan moving air in a second direction spread airflow generally opposite to the first direction of the first outlet aperture, wherein the second, curvilinear impeller aperture curves around the diameter of the blower fan on the impeller side of the dual opposite combined blower and impeller system.

9. The system of claim 8, further comprising:
the fin stack located at an exhaust vent of the information handling system chassis and thermally coupled to the central processor.

10. The system of claim 8, further comprising:
wherein the second, curvilinear impeller aperture provides a spread airflow angle of at least 30 degrees from the blower fan into an internal cavity of the information handing system chassis.

11. The system of claim 8, wherein a diameter of the blower fan including the plurality of blades is greater than 75% of a width of the dual opposite combined blower and impeller system housing between the first side wall and the second side wall.

12. The system of claim 8, further comprising:
a second dual opposite combined blower and impeller system for thermal management.

13. The system of claim 8, further comprising:
the first surface of the dual opposite combined blower and impeller system housing operatively having the fan inlet aperture coupled to a chassis inlet vent such that the fan inlet aperture draws air from outside the information handling system chassis.

14. The system of claim 8, further comprising:
seals along seams of the information handling systems chassis to prevent leakage of pressure from internal cavity of the chassis and direct airflow to at least one outlet vent of the chassis.

15. The system of claim 1 wherein the first notch is a curvilinear extension inside the dual opposite combined blower and impeller system housing to pressurize air upon rotation of the powered blower fan in the dual opposite combined blower and impeller system housing along the first side wall force air to exit the first outlet aperture.

16. A method of assembling an information handling system with powered blower fan comprising:
operatively coupling a central processor, a memory, and a power source in an information handling system chassis;
thermally coupling the central processor and the graphics processor to a fin stack;
orienting the fin stack at an exhaust vent of the information handling system chassis;
installing a dual opposite combined blower and impeller system having a powered blower fan for rotating a plurality of blades within a dual opposite combined blower and impeller system housing where a first aperture on a blower side of the dual opposite blower and impeller system housing between a first side wall and a second side wall oppositely disposed to the first side wall is aligned to move air across the fin stack in a rotational plane of the powered blower fan and a second, curvilinear impeller aperture is oriented to spread airflow angle at least 30 degrees in an opposite direction in the rotational plane of the powered blower fan internally to the information handling system chassis;

aligning a first surface of the dual opposite combined blower and impeller system housing having an inlet fan aperture over an inlet vent in the information handling system chassis to draw air from outside the information handling system chassis; and operatively coupling the power source to a motor of the powered blower fan mounted inside the dual opposite blower system housing.

17. The method of claim 16, further wherein the first side wall of the dual opposite combined blower and impeller system housing has a first notch extending internally along a fan diameter in the rotational plane of the powered blower fan to compress air moved by the powered blower fan out of the first aperture on the blower side.

18. The method of claim 16, further comprising:
orienting a second cooling fin stack at a second exhaust vent of the information handling system chassis.

19. The method of claim 18, further comprising:
operatively coupling the second cooling fin stack with a second dual opposite combined blower and impeller system at an outlet aperture and at the second exhaust vent of the information handling system chassis.

20. The method of claim 16 wherein the fan diameter including the plurality of blades of the powered blower fan is at least 85% the width of the dual opposite combined blower and impeller system housing between first side wall and the second side wall.

* * * * *